(12) United States Patent
Erchak et al.

(10) Patent No.: US 7,959,341 B2
(45) Date of Patent: Jun. 14, 2011

(54) LED COLOR MANAGEMENT AND DISPLAY SYSTEMS

(75) Inventors: Alexei A. Erchak, Cambridge, MA (US); Michael Lim, Cambridge, MA (US); Nikolay I. Nemchuk, North Andover, MA (US); Alexander L. Pokrovskiy, Burlington, MA (US); Robert F. Karlicek, Jr., Chelmsford, MA (US); Rashmi Kumar, Billerica, MA (US)

(73) Assignee: Rambus International Ltd., Grand Cayman (KY)

( * ) Notice: Subject to any disclaimer, the term of this patent is extended or adjusted under 35 U.S.C. 154(b) by 1211 days.

(21) Appl. No.: 11/600,548

(22) Filed: Nov. 16, 2006

(65) Prior Publication Data

US 2008/0019147 A1 Jan. 24, 2008

Related U.S. Application Data

(60) Provisional application No. 60/832,243, filed on Jul. 20, 2006.

(51) Int. Cl.
*G09G 3/36* (2006.01)
(52) U.S. Cl. ........ 362/612; 362/231; 362/552; 362/555; 362/295; 362/583; 345/102
(58) Field of Classification Search .................. 362/583, 362/231, 295, 552, 555; 345/102, 83, 88
See application file for complete search history.

(56) References Cited

U.S. PATENT DOCUMENTS

| | | | |
|---|---|---|---|
| 5,771,039 A | 6/1998 | Ditzik | |
| 6,636,003 B2 | 10/2003 | Rahm et al. | |
| 6,831,302 B2 | 12/2004 | Erchak et al. | |
| 6,888,322 B2 | 5/2005 | Dowling et al. | |
| 6,888,529 B2 | 5/2005 | Bruning et al. | |
| 7,098,443 B2 | 8/2006 | Tan et al. | |
| 7,108,413 B2 * | 9/2006 | Kwong et al. | 362/583 |
| 7,295,180 B2 * | 11/2007 | Ichikawa et al. | 345/102 |
| 2005/0040424 A1 | 2/2005 | Erchak et al. | |
| 2006/0097978 A1 | 5/2006 | Ng et al. | |
| 2007/0045640 A1 | 3/2007 | Erchak et al. | |
| 2007/0211183 A1 | 9/2007 | Erchak et al. | |

OTHER PUBLICATIONS

International Search Report from PCT/US2007/16317, mailed Jul. 18, 2008.

* cited by examiner

*Primary Examiner* — Anabel M Ton
(74) *Attorney, Agent, or Firm* — Renner, Otto, Boisselle & Sklar, LLP

(57) ABSTRACT

Illumination systems, which include at least one light source (e.g., LED and/or laser diode), light sensor, and a power source are described. In certain embodiments, a light sensor and a microprocessor are used to detect light emitted by a light source and to adjust the power signal provided to the light source at least partially based on the detected light. Some embodiments may enable the color point and/or brightness of the emitted light to be controlled at least partially based on the detected light. The illumination systems may be designed to be used as a liquid crystal display (LCD), general lighting apparatus, or any other illumination device.

50 Claims, 19 Drawing Sheets

LED COLOR MANAGEMENT AND DISPLAY SYSTEMS

RELATED APPLICATIONS

This application claims priority under 35 U.S.C. §119(e) to U.S. Provisional Application Ser. No. 60/832,243, filed on Jul. 20, 2006, which is herein incorporated by reference in its entirety.

FIELD OF INVENTION

The present invention generally relates to illumination systems and/or display systems such as liquid crystal display systems (LCDs). More specifically, to display systems that include light-emitting diodes (LEDs) as light sources and a control system.

BACKGROUND

Liquid Crystal Display (LCD) systems have increased in popularity and availability during recent years due to their light weight, high brightness, and size. Likewise, as LCD technology has developed, so has the digital and high definition imaging technology developed. Specifically, high quality/high performance display systems such as High Definition Televisions (HDTV), and projectors have taken a new approach of progressively scanning an image onto a viewing screen to enhance the viewing performance. Progressive scanning of an image can be a challenge for a high performance display system such as an LCD.

Furthermore, brightness and contrast of each color can become important aspects in producing a high quality display system. Typically, LCD systems are commonly backlit by an array or multiple arrays of LEDs. As the size of a display increases, a larger number of LEDs is typically required to illuminate the display. However, large numbers of LEDs in a display can increase the complexity of the system, energy consumption, and/or the cost of manufacturing and controlling the color of such a system.

SUMMARY OF THE INVENTION

Accordingly, the present invention provides an illumination system and methods for controlling the light output (e.g., color point and/or brightness) of such illumination systems.

In one aspect, an illumination system comprises a plurality of light sources. Each of the plurality of light sources is configured to emit light. The illumination system includes a light sensor configured to detect the emitted light from the plurality of light sources and output at least one signal characteristic of the detected light. The illumination system further includes a power source configured to supply power to at least one light source of the plurality of light sources. The illumination system also includes a control unit configured to receive the at least one signal from the light sensor, obtain a value characteristic of the light emitted by the at least one light source at least partially based on the at least one signal provided by the light sensor, and control the power source to modify the power supplied to the at least one light source at least partially based on the value characteristic of the light emitted by the at least one light source.

In one aspect, an illumination system comprises a plurality of illumination panels arranged in a planar arrangement, and wherein each of the plurality of illumination panels is substantially adjacent to at least one other illumination panel of the plurality of illumination panels. The illumination system further comprises a plurality of light sources configured to emit light so that each of the plurality of the illumination panels are edge-lit by one or more of the plurality of light sources through at least one edge of each of the plurality of the illumination panels. The illumination system includes at least one light sensor configured to detect the emitted light from at least some of the plurality of light sources and output at least one signal characteristic of the detected light. The illumination system comprises a power source configured to supply power to at least one light source of the plurality of light sources. The illumination system includes a control unit configured to receive the at least one signal from the at least one light sensor, and control the power source to modify the power supplied to the at least one light source at least partially based on the at least one signal provided by the at least one light sensor to achieve a desired color point of the emitted light from the at least some of the plurality of light sources.

In one aspect, a method is provided for controlling a light color point of emitted light. The method comprising supplying power to at least one light source, emitting light from the at least one light source, detecting a color point of the emitted light, and varying the power supplied to the at least one light source to achieve a desired light color point of the emitted light.

In one aspect, a display system comprises at least one illumination panel having at least one edge, a liquid crystal spatial light modulator disposed at least partially over the illumination panel, and a plurality of light sources configured to emit light so that the illumination panel is edge-lit by the plurality of light sources through the at least one edge of the illumination panel, wherein the at least one illumination panel is sequentially illuminated by the plurality of light sources.

Other aspects, embodiments and features of the invention will become apparent from the following detailed description of the invention when considered in conjunction with the accompanying drawings. The accompanying figures are schematic and are not intended to be drawn to scale. In the figures, each identical, or substantially similar component that is illustrated in various figures is represented by a single numeral or notation.

For purposes of clarity, not every component is labeled in every figure. Nor is every component of each embodiment of the invention shown where illustration is not necessary to allow those of ordinary skill in the art to understand the invention. All patent applications and patents incorporated herein by reference are incorporated by reference in their entirety. In case of conflict, the present specification, including definitions, will control.

DESCRIPTION

Systems and methods for color management and/or light source control of illumination systems, such as liquid crystal displays (LCD), are provided. By utilizing an illumination system, as disclosed herein, an LCD panel having uniform color distribution, simplistic design, and/or economical manufacturing savings can be achieved.

Applicants have appreciated that multi-color illumination systems can benefit from precise color mixing to ensure that users perceive expected color renditions. This issue may become especially acute when using multiple LEDs emitting different colors of light (e.g., red, green, blue LEDs). Proper homogenized light emitted from LEDs (e.g., LEDs emitting red, green, and blue light) can produce a desirable color point (e.g., white light). Slight variations in the brightness and/or emission wavelength(s) of the LEDs can cause differences in the perceived color of the respective illumination panel and/or region of the illumination panel that is being lit. It should be appreciated that the systems as described herein can utilize any light source(s), such as, laser(s), halogen lamp(s), LED(s), etc. Although most examples presented herein are drawn towards the use of LEDs, this should not be construed as limiting, since these are only some exemplary embodiments and other light sources can be used instead of, or in addition to, LEDs.

Applicants have further appreciated that controlling the color point and/or brightness of the emitted light can be even more critical when an illumination system utilizes multiple illumination panels, as any significant variation of the emitted light (e.g., color point and/or brightness) in each illumination panel may result in an observer perceiving the boundaries of the illumination panels.

Figure 1:
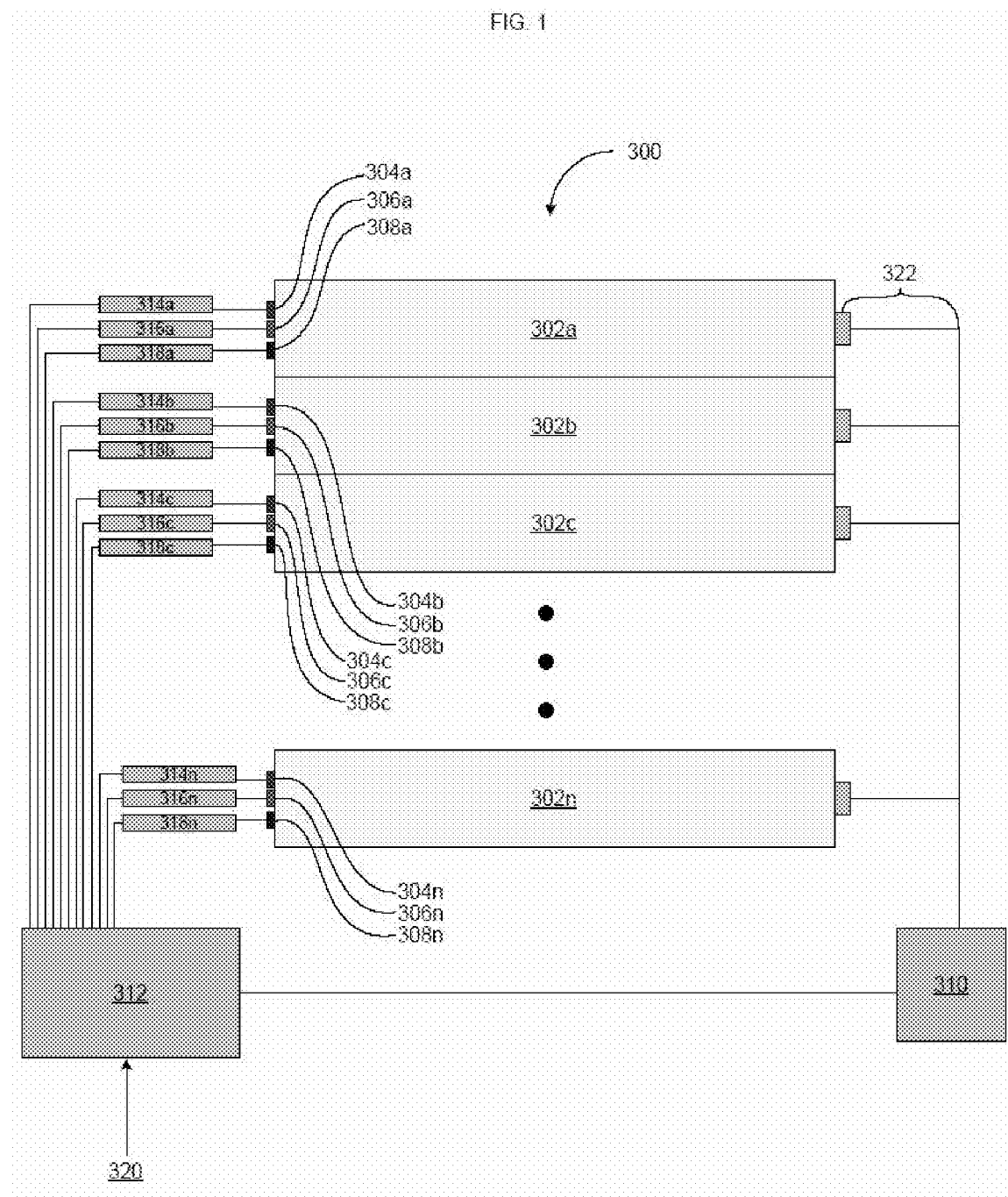
FIG. 1 illustrates an illumination system which includes a light source, illumination panel, color sensor, microprocessor, and drivers, according to one embodiment.

FIG. 1 shows an illumination system 300 which may include at least one illumination panel 302a, in accordance with one embodiment. However, it should be appreciated that a plurality of illumination panels such as 302b and 302c, or as many illumination panels as desired, as depicted by 302n, may be included in an illumination system, such as illumination system 300. For illumination systems including multiple illumination panels, the panels may be arranged in a planar arrangement, wherein each of the illumination panels may be substantially adjacent to at least one other illumination panel. The arrangement of multiple illumination panels placed substantially adjacent to one another may be perceived as a single illumination panel by an observer. Multiple panels may be arranged in any desirable configuration. In some embodiments, the multiple illumination panels may be horizontally arranged, as illustrated in FIG. 1. In other embodiments, the multiple illumination panels may be vertically arranged.

The illumination system can also include one or more light sources (e.g., LEDs and/or laser diodes), such as LEDs that emit red (R), green (G), and/or blue (B) light, as depicted by 304a, 306a, 308a, respectively. Alternatively, or additionally, the illumination system may include LEDs that emit cyan, amber, and/or yellow light, as the techniques presented herein are not limited in this respect. Alternatively, or additionally, the illumination system may include LEDs that emit red, green, blue, cyan, amber, and/or yellow light, which may be assembled in one package.

One or more LEDs may illuminate one illumination panel. In one embodiment, three LEDs illuminate one illumination panel, as shown by 304b, 306b, 308b, . . . 304n, 306n, and 308n. In other embodiments, only one LED illuminates an illumination panel, and in still other embodiments, more than three LEDs illuminate an illumination panel. In one embodiment including a plurality of illumination panels, each illumination panel may be illuminated by at least one LED chipset (e.g., a RGB LED chipset) configured to emit light of differing wavelengths (e.g., red, green, blue), wherein the intensity of light emitted for differing wavelengths may be controlled individually.

LEDs having suitable characteristics for use in an illumination system may include a pattern which can affect the emission of light from the LED. Such a pattern may include a dielectric function that varies spatially, such as a periodic pattern and/or a non-periodic pattern. Furthermore, as used herein, a pattern may include an interface or surface morphology resulting from surface roughening. Examples of such LEDs are described in more detail below and in U.S. Pat. No. 6,831,302 which is incorporated by reference in its entirety.

As used herein, an LED may be an LED die, two or more associated LED dies, a partially packaged LED die or dies, or a fully packaged LED die or dies. An example of an LED that includes two or more LED dies associated with one another is a red-light emitting LED die associated with a green-light emitting LED die and a blue-light emitting LED die. The two or more associated LED dies may be mounted on a common substrate (e.g., a common package). The two or more LED dies may be associated such that their respective light emissions may be combined to produce a desired spectral emission. The two or more LED dies may also be electrically associated with one another (e.g., connected to a common ground).

In some embodiments, an LED is a single-colored LED that emits light of a single color. For example, the LED may be an R LED (i.e., a red LED), a G LED (i.e., a green LED), a B LED (i.e., a blue LED), a Y LED (i.e., a yellow LED), a C LED (i.e., a cyan LED), or and amber LED. In other embodiments, the LED is a multi-colored LED that emits light having a spectrum of wavelengths. For example, the LED may be a RGB LED (i.e., a red-green-blue LED). In other embodiments, an LED is a RGBY LED (i.e., a red-green-blue-yellow LED). In yet other embodiments, an LED is a RGBC LED (i.e., a red-green-blue-cyan LED). In yet other embodiments, an LED is a RGBCY LED (i.e., a red-green-blue-cyan-yellow LED). In still another embodiment, the LED may be a phosphor covered LED configured to emit white light (e.g., a blue LED covered with a yellow phosphor material). Of course, LEDs emitting other colors of light can also be used, as the techniques presented herein are not limited in this respect.

Also, as used herein, an LED can be referred to by specifying the wavelength(s) of the light emitted by the LED. It should be understood that the LED may include one or more phosphor coatings over a semiconductor die which can influence the wavelength(s) of the emitted light. For example, an LED emitting green light may comprise a semiconductor die emitting blue light which is coated with a green phosphor. An LED emitting white light may comprise a semiconductor die emitting blue light which is coated with a yellow phosphor. Furthermore, a single semiconductor die may be coated with different phosphors in separate regions, for example, a semiconductor die that emits blue (or ultraviolet) light may be coated with a red phosphor in a first region, a green phosphor in a second region, and left uncoated in a third region. Such an LED can generate multiple wavelength(s) (e.g., red, green, and/or blue light) from a single semiconductor die.

Illumination system 300 can include at least one driver 314a, 316a, and 318a per LED 304a, 306a, and 308a, respectively. A driver can be a power source or power component which can regulate and provide power to one or more LEDs. The driver can provide a power signal to one or more LEDs, wherein the power signal may have any suitable waveform, including, but not limited to, a pulsed or continuous waveform. Electrical power supplied to one or more LEDs may be varied by modifying the duty cycle of the power signal and/or the amplitude of the power signal. In some embodiments, the duty cycle of a pulsed power signal provided to one or more LEDs may be varied by modifying the frequency of the pulses, the width of the pulses, and/or the amplitude of the pulses. A pulsed signal allows the LED to be operated at a desired duty cycle (e.g., 75% duty cycle, meaning the LED is "on" 75% of the time). This is in contrast to a duty cycle of 100% or a continuous "on" state. The pulses or on/off times can be switched fast enough (e.g., on the order of about microseconds) that the human eye may interpret the LED as being "on" constantly.

In some embodiments, an illumination system may further include a light guiding element, also referred to as an optical guide. For example, the embodiment illustrated in FIG. 1 can further include a light guiding element 322. The light guiding element can be an optical light pick-up component. For example, the light guiding element can include an optical fiber. In another embodiment the light guiding element can include an optical fiber and a photodetector. In still another embodiment, the light guiding element may include a reflector element to guide or channel the light to a light sensor 310.

A single light guiding element can be associated with only one illumination panel, or one light guiding element may be associated with multiple illumination panels. For instance, it may be desirable to emit light into the modular illumination panels 302, which can be arranged horizontally or vertically next to each other, from LEDs 304, 306 and 308. The light guiding element 322 can receive at least some of the emitted light from the LEDs and transfer the light to a light sensor 310 that can output a signal characteristic or representative of the emitted light.

In some embodiments, the light sensor 310 may be configured to detect light associated with one or more wavelengths and may output a signal including color point information of the detected light. As should be appreciated by those of skill in the art, the light sensor may include any suitable type of device(s) capable of generating a signal based on the detected light, such as one or more photodetectors.

In some embodiments, an optical guide may be arranged to receive light from any region of the illumination panel. In one embodiment, an illumination panel may be partitioned into multiple regions, including a mixing region in which light emitted from the light sources may be homogenized and a dispersing region which may emit light over a display area. For illumination panels having mixing and dispersing regions, the optical guide may be arranged to receive light from the mixing region and/or the dispersing region of the illumination panel.

Figure 2:
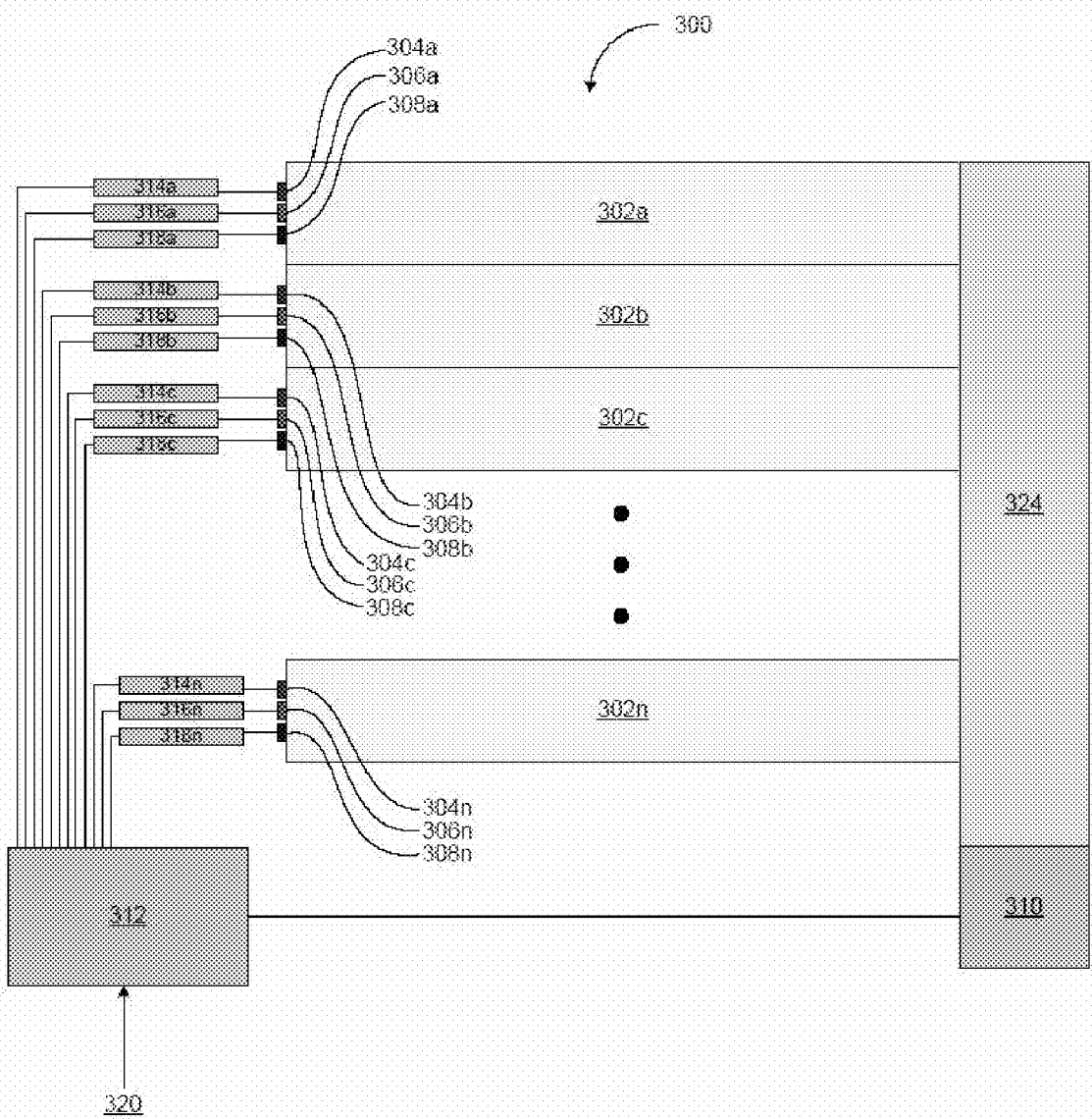
FIG. 2 illustrates an illumination system which includes a light source, illumination panel, microprocessor/sensor, and drivers, according to one embodiment.

Alternatively, as shown in FIG. 2, the light guiding element can include a light guiding panel 324, in accordance with one embodiment. The light guiding panel can be comprised of the same material as the illumination panel. In such systems where the light guiding panel comprises the same material as the illumination panel, the light guiding panel may receive and transfer light to the light sensor without altering the color point of the light. However, it should be appreciated that the light guiding panel can be made of a material different than the illumination panel, as the techniques presented herein are not limited in this respect.

Light sensor 310 may be configured to output information characteristic or representative of the emitted light to the microprocessor unit 312. In some embodiments, light sensor 310 may output a signal including information characteristic or representative of the color point of the detected light. In some embodiments, light sensor 310 may output a signal including information characteristic or representative of the intensity of the detected light.

One or more sensors can be configured to detect emitted light for each illumination panel and provide an output characteristic of the emitted light for each illumination panel to the microprocessor unit 312. The microprocessor unit 312 may include a control unit that can control one or more drivers supplying power to one or more LEDs at least partially based on the signal(s) outputted by the one or more sensors. Such a configuration can be utilized to control the color point and/or brightness of the light emitted into one or more illumination panels.

In the figures shown herein, a single light sensor 310 is shown for detecting the emitted light. In other embodiments, multiple light sensors may be used to detect the emitted light from one or more illumination panels.

In embodiments where a single light sensor is utilized, the LEDs can be sequentially illuminated (e.g., progressively illuminated) so as to ensure that the light sensor detects light from only one panel (or even only one LED) at any given time. As used herein, sequential illumination refers to an illumination process whereby at least some of the panels are illuminated in the order in which they are arranged spatially (e.g., some panels may be skipped during an illumination cycle). Progressive illumination refers to a type of sequential illumination whereby each illumination panel is illuminated after a preceding adjacent panel has been illuminated or each illumination panel is de-illuminated after an illuminated preceding adjacent panel. For progressive illumination, no panels are skipped in a given illumination cycle.

In the context of the system illustrated in FIG. 2, an example of progressive illumination includes illuminating panel 302a, followed by panel 302b, and so on, until panel 302n is illuminated. In the context of the system illustrated in FIG. 2, an example of sequential illumination includes illuminating all the even panels (or odd panels) in order, for example, illuminating panel 302a, followed by panel 302c, and so on. It should be appreciated that this is just one example of sequential illumination as any of the panels may be skipped during a given illumination cycle.

Although sequential illumination of panels has been described in the context of an illumination system having one light sensor for all the panels in the illumination system, the techniques presented herein are not limited in this respect. Sequential illumination (e.g., progressive illumination) may be used in illumination system having multiple light sensors, or even no light sensors.

It should also be appreciated that illumination panels and/or individual LEDs may be sequentially (e.g., progressively) turned on or off. In embodiments where the illumination panels and/or individual LEDs are sequentially (e.g., progressively) turned on, all of the illumination panels and/or individual LEDs except for one illumination panel and/or individual LED may be off at a first time. At a second time, the illumination panel and/or individual LED that was on may be turned off and the next illumination panel and/or individual LED in the sequence (or progression) may be turned on. In embodiments where the illumination panels and/or individual LEDs are sequentially (e.g., progressively) turned off, all of the illumination panels and/or individual LEDs except for one illumination panel and/or individual LED may be on at a first time. At a second time, the illumination panel and/or individual LED that was off may be activated so as to be illuminated and the next illumination panel and/or individual LED in the sequence (or progression) may be turned off. It should be understood that these are just some illustrations of sequential and progressive illumination and other ways of providing sequential and progressive illumination are possible. In the context of the illumination system 300 of FIG. 3, sequential illumination enables the light sensor to sample the light emitted into panels as the sequential illumination process proceeds from panel 302a to 302n (or vice versa) of the illumination system 300. Thus, using a sequential illumination process, characteristics of the emitted light (e.g., color point and/or brightness) for the illuminated panels can be detected, and optionally controlled, for each frame of the video signal 320 received (e.g., 30 Hz, 60 Hz, 120 Hz, 150 Hz, 180 Hz, or any multiple of the NTSC standard).

A color point may be specified as a mixture of red, green, and blue light, or other combinations of colors, as the techniques presented herein are not limited in this respect. In one embodiment, the color point can be specified by a proper ratio of red, green, and blue light. Obtaining a desired color point can be accomplished by a color sensing unit (e.g., light sensor 310) that is capable of sampling and detecting each individual color, comparing the individual colors to desired values as defined by the desired color point, and adjusting or providing information that enables adjusting the light output of the LEDs to obtain the desired color point. The detection of each color can also be facilitated with the use of a filter, such as a dichroic filter, a prism, a grating, or any other color separation and/or detection component known to those skilled in the art.

Microprocessor unit 312 can receive information characteristic of the emitted light (e.g., color point and/or brightness information) for each illumination panel (e.g., 302a, 302b, 302c, 302n, etc.) from the sensor 310. The microprocessor may use the received information to obtain a value characteristic of the light emitted by at least one of the plurality of LEDs based at least partially on the received signal from the sensor. The microprocessor may control the power provided to one or more LEDs based at least partially on the received signal from the sensor.

Microprocessor unit 312 can be a control unit that can perform multiple functions for the illumination system, such as receiving video input 320, receiving the output signal from light sensor 310, obtaining a value characteristic of the light emitted by one or more LEDs (of a plurality of LEDs) based at least partially on the signal provided by the light sensor, and controlling one or more power source drivers to modify the power supplied to the one or more LEDs based at least partially on the value characteristic of the light emitted by the one or more LEDs. In one embodiment, the control unit can control the power source drivers to modify the power supplied to the one or more LEDs so as to achieve a desired color point of the emitted light. In one embodiment, the control unit can control the power source drivers to modify the power supplied to the one or more LEDs so as to achieve a desired brightness of the emitted light.

In illumination systems comprising a plurality of illumination panels, the microprocessor can be a control unit that controls the power supplied to one or more LEDs illuminating each illumination panel so as to control one or more power source drivers to modify the power supplied to the LEDs associated with the given panel based at least partially on the value characteristic of the light emitted by the LEDs of the given panel. In one embodiment, the microprocessor 312 can compare the detected color points and/or brightness of light illuminating each panel with a desired color point and adjust the power supplied to one or more of the LEDs to produce the desired color point for the emitted light.

Adjustment of the power provided to an LED can be accomplished by monitoring the emitted light (e.g., as detected by light sensor 310) and adjusting the power signal to the LED as provided by one or more of the power source drivers (314a, 316a, 318a ... 314n, 316, and 318n). In some embodiments, a control unit, such as microprocessor 312, can differentiate between the light output of different LEDs. So even though the light sensor may simply detect one combined light output (e.g., from each illumination panel or combined over all panels of the illumination system), a value characteristic of the light 4 output of one or a subset of LEDs may be deduced at least partially based on the combined light output.

In one embodiment, light output of some LEDs may be deduced at least partially based on detected light intensity for different wavelengths of the detected light. Light intensity for different wavelengths may be obtained by a light sensor configured to detect light associated with one or more wavelengths. Such a light sensor may include a filter, such as a dichroic filter, a prism, or any other color separation and/or detection component known to those skilled in the art. The light sensor may detect the light intensity for a plurality of wavelengths and/or wavelength bands. Detected light intensity information for the plurality of wavelengths and/or wavelength bands may be used to provide an output signal characteristic of the detected light which includes information about the color point of the detected light.

Alternatively, or additionally, the signal provided by the light sensor may include information characteristic of the light intensity in a panel for the plurality of wavelengths and/or wavelength bands. A control unit can utilize such information to differentiate between the light output of some LEDs that are configured to emit light at different wavelengths and/or wavelength bands. The control unit can then adjust one or more of the LEDs associated with a given wavelength and/or wavelength band so as to achieve a desired light output for that given wavelength. It should be understood that such a method may not necessarily be capable of differentiating between the light output of LEDs emitting at the same wavelength. However, it should be further appreciated that LEDs emitting at the same wavelength but illuminating different illumination panels in a multi-panel system can be differentiated based on the panel they are associated with. For example, each panel may be illuminated at different times and hence the light sensor output at a given time can be associated with one or more of the LEDs illuminating the active panel. Such a scheme is a type of time division multiplexing scheme, as described further below.

In one embodiment, light output of some LEDs may be deduced at least partially based on utilizing a time division multiplexing operation scheme. In such a scheme, one or more LEDs of a plurality of LEDs providing illumination for an illumination system may be activated at different times than the other LEDs. The detected light at a given time will thus comprise of light output from one or more LEDs that are activated at a given time. In this manner, the light output for a plurality of LEDs may be differentiated. The time duration during which one or more LEDs are activated (e.g., "turned on") and the other LEDs are not activated may be selected to be short so as to not be perceivable by an observer (e.g., on the order of microseconds).

A time division multiplexing operation scheme for LEDs in an illumination system may be implemented using any type of power signal waveform supplied to the LEDs. A pulsed power signal waveform may be supplied to the LEDs, and a time division scheme may be achieved by ensuring that the pulsed power signals applied to different LEDs do not possess pulses that substantially overlap.

In one embodiment, light output of some LEDs may be deduced at least partially based on utilizing a frequency division multiplexing scheme. In such a scheme, one or more LEDs of a plurality of LEDs providing illumination for an illumination system may be driven by power signals having different frequency spectrums. The light emitted by the LEDs can thus have different frequency spectrums so that upon detection, frequency distribution analysis may be used to determine an intensity of light output associated with the one or more LEDs.

For example, different LEDs may be driven with power signals having distinct high frequency components which may be superimposed on a pulsed signal having a lower frequency (e.g., 30 kHz). In some embodiments, the high frequency component may be a signal (e.g., a high frequency pulsed signal) having a frequency greater than about 10 kHz and/or less than about 100 MHz. Each of the LEDs, whose output is to be differentiated using a frequency division multiplexing scheme, may have a different high frequency component. For example, LEDs may have high frequency components that differ by less than about 1 MHz, less than about 100 kHz, less than about 50 kHz, less than about 10 kHz, and less than about 1 kHz.

Upon detection of a combined light output (e.g., by a light sensor), a frequency distribution may be obtained, for example using a Fourier transform. High frequency component amplitudes may be extracted from the frequency distribution. Each high frequency amplitude may be characteristic of the intensity of the emitted light for a specific LED, or more than one LED, driven by a power signal with the high frequency component. A control unit may utilize the deduced intensity for each LED (or group of LEDs) to determine whether the LED is outputting a desired light output, as may be specified by set point light output values for each LED (or group of LEDs). The control unit then may vary the power supplied to each LED (or group of LEDs) so that the LED outputs a desired light output.

It should be appreciated that two or more methods for differentiating between the light output of LEDs based on a combined detected light output may be used in combination, as the techniques presented herein are not limited in this respect. Using one or more light output differentiation techniques, a value characteristic or representative of the light output of a subset of LEDs smaller than all the LEDs (e.g., for one or more illumination panels) may be obtained. Alternatively, or additionally, a value characteristic or representative of the light output of all the LEDs (e.g., for one or more illumination panels) may be obtained.

In some embodiments, the microprocessor 312 may control the light provided to the LEDs of the illumination system to achieve a desired color point for the detected light output (e.g., for each panel of the illumination system). For example, if it is determined that a higher intensity of red light is needed to obtain a desired color point, power source 314a, 314b, 314c and/or 314n can be adjusted by increasing the duty cycle of a pulsed power signal provided to LEDs 304a, 304b, 304c and/or 304n. This type of a system can be conducive for illumination systems that utilize LEDs because the brightness of the LEDs can degrade over the lifespan of the LED.

As previously described, in some embodiments, light may be emitted by an LED coated with a phosphor, which can be used to emit white light. For example, a blue LED coated with yellow phosphor material can emit white light. In such an embodiment, the color point (e.g., white point when the LED emits white light) of the emitted light can be adjusted by increasing the duty cycle and/or the amplitude of the power signal supplied to the LED. Phosphor coated LEDs are described in U.S. Pat. No. 7,084,434, which is incorporated herein by reference in its entirety.

Figure 3:
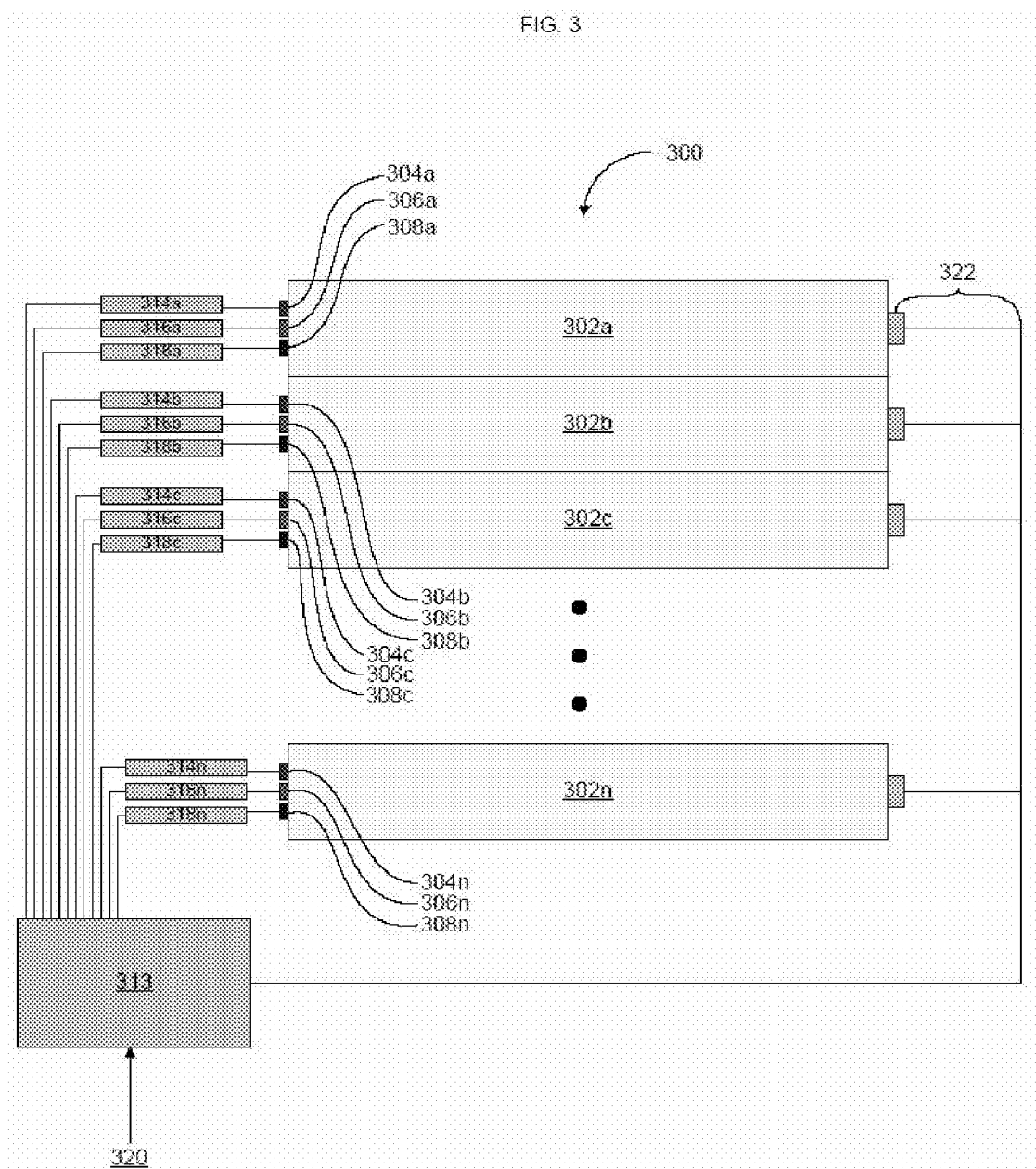
FIG. 3 shows another illumination system which includes a light source, illumination panel, a light guide panel, color sensor, microprocessor, and drivers, according to some embodiments.

FIG. 3 illustrates an illumination system 300 which utilizes a light sensing/control unit 313, in accordance with one embodiment. Such a unit may be multi-functional unit that can detect and sample light from each illumination panel 302a-n, receive a video signal, control the panel illumination based at least partially on the video signal 320, and control the power driver sources 314a-n, 316a-n, and 318a-n providing power to the LEDs. Light sensing/control unit 313 can include a microprocessor and a light sensor. Such an embodiment can reduce manufacturing steps and overall cost for an illumination system such as an LCD TV and/or monitor.

Figure 4:
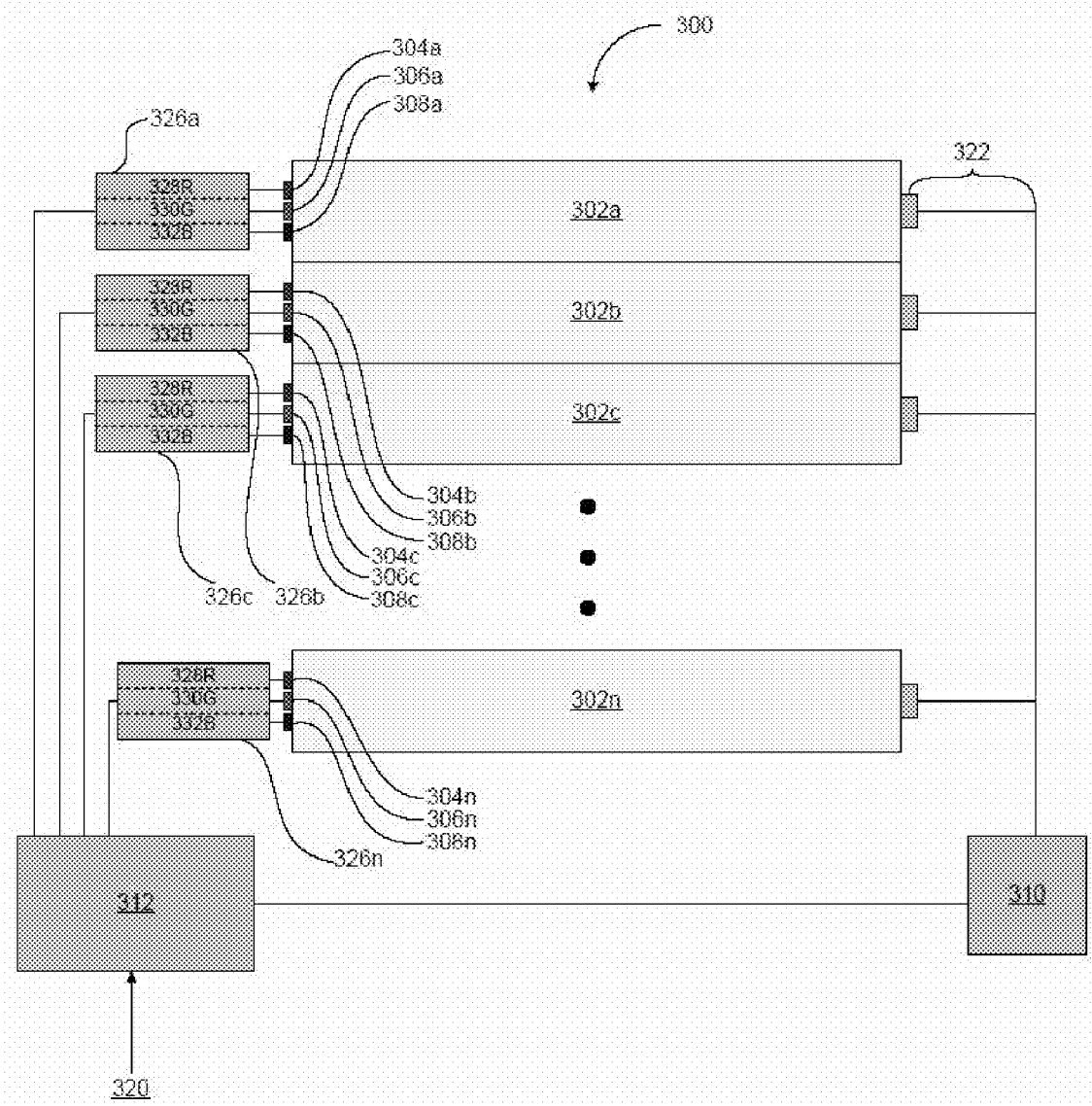
FIG. 4 shows an illumination system including light sources, a single driver associated with the respective light source, an illumination panel, optical guide, light sensor, and microprocessor, according to yet another embodiment.

FIG. 4 depicts a single power source 326a-n for each LED associated with the respective illumination panel 302a-n, in accordance with one embodiment. Power source 326 can comprise multiple channels 336R, 338G, 340B, configured to supply power and/or drive each respective LED 304a-n, 306a-n and 308a-n.

Figure 5:
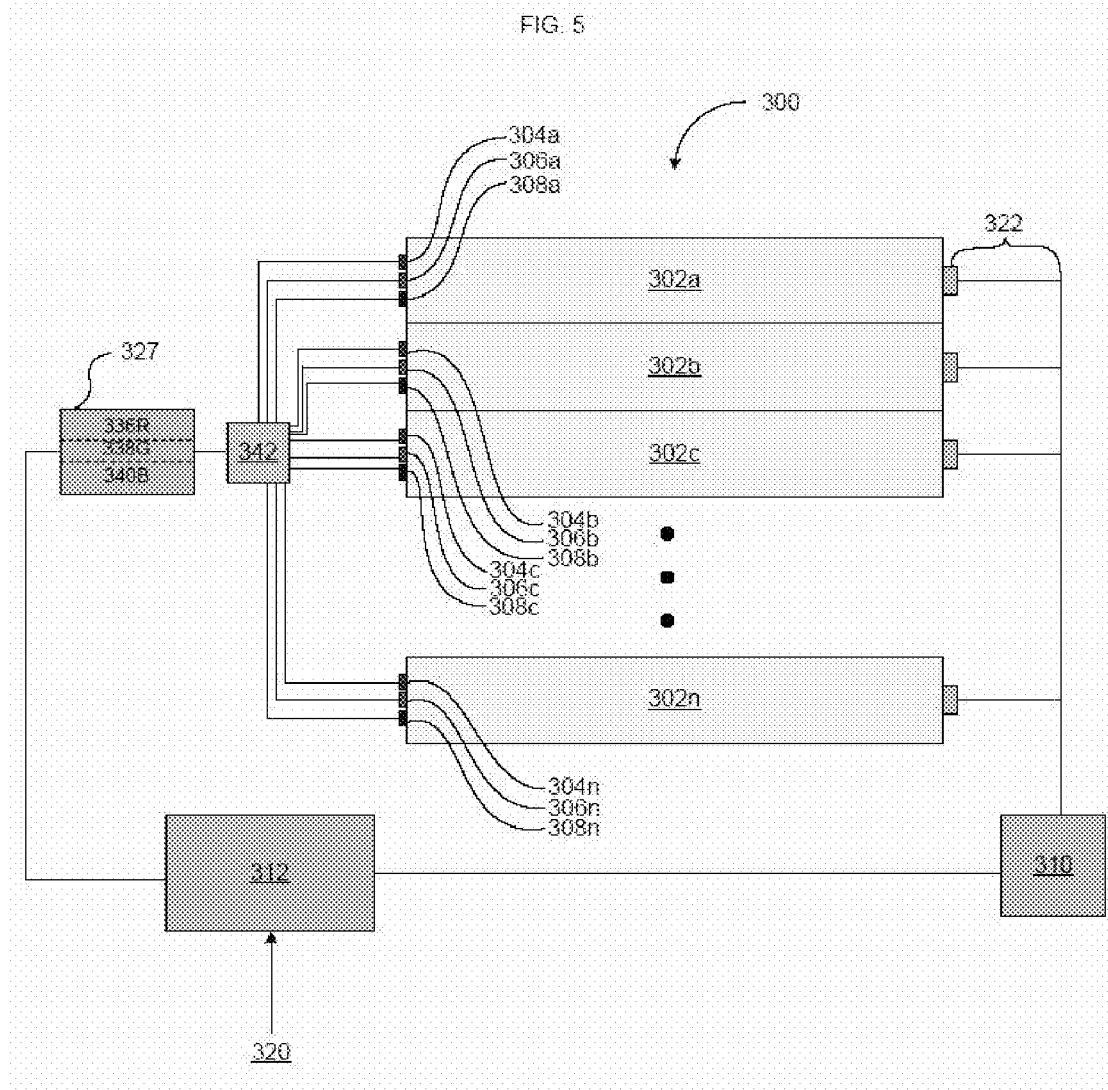
FIG. 5 shows an illumination system including light sources, one driver associated with the light sources, an illumination panel, optical guide, light sensor and microprocessor, according to one embodiment.

FIG. 5 illustrates a single power source 327 for all LEDs incorporated in the system, in accordance with one embodiment. Power source 327 can also comprise multiple driver channels 336R, 338G, 340B, which may each be configured to provide a power signal associated with LEDs emitting different colors of light. A switching unit 342 can switch the power signal output from the power source 327 so as to provide the power signal to one or more desired LEDs. Switching can be timed so as to correlate with the sequential scanning (e.g., progressive scanning) of the LEDs and/or illumination panels. Power source 327 may be configured to switch the power signal at high frequencies and rates (e.g., with switching periods on the order of microseconds) thus a field-effect transistor (FET) can be incorporated in the power source and switching unit design. These embodiments can provide economical benefits as well as size benefits to such an illumination system.

The illumination systems as described herein can serve as display systems or optical systems, such as liquid crystal display systems (LCDs) that include LEDs or laser diodes as light sources. The description presented herein includes several display systems that can use fewer numbers of LEDs per illumination area compared to certain conventional display systems of similar size. In some embodiments, these illumination systems use high-brightness LEDs to illuminate the display in combination with thermal management systems and other components described herein. Advantageously, reducing the numbers of LEDs in an illumination system can simplify the system design, which can increase the reliability of the system and/or result in lower cost of manufacture. Such systems are particularly suitable for large area displays. Additionally, as described further below, the systems may be designed to use fewer numbers of LEDs for illumination while achieving a brightness comparable to, or exceeding, certain existing display systems of similar size. Furthermore, although commercially-available displays are generally back-lit due to the low brightness of LEDs used in such displays, displays can be edge-lit or corner-lit when high-brightness LEDs and associated components are used. As used herein, corner-lit displays are a type of edge-lit display wherein light is provided from one or more corners of the display. However, it should be appreciated that the techniques presented herein can be utilized for edge-lit, corner-lit and/or back-lit illumination systems.

In some embodiments, an illumination system may include a plurality of back-lit illumination panels. The back-lit illumination panels many have any suitable aspect ratios and dimensions so as to cover the display area. In one such embodiment, the illumination panel comprises multiple back-lit illumination tiles. The tiles may be arranged so as to form a two-dimensional array that covers the display area. One or more of the tiles may illuminated via a back-lit arrangement. Illumination may be provided by one or more light sources, such as one or more LEDs or laser diodes.

Figure 6:
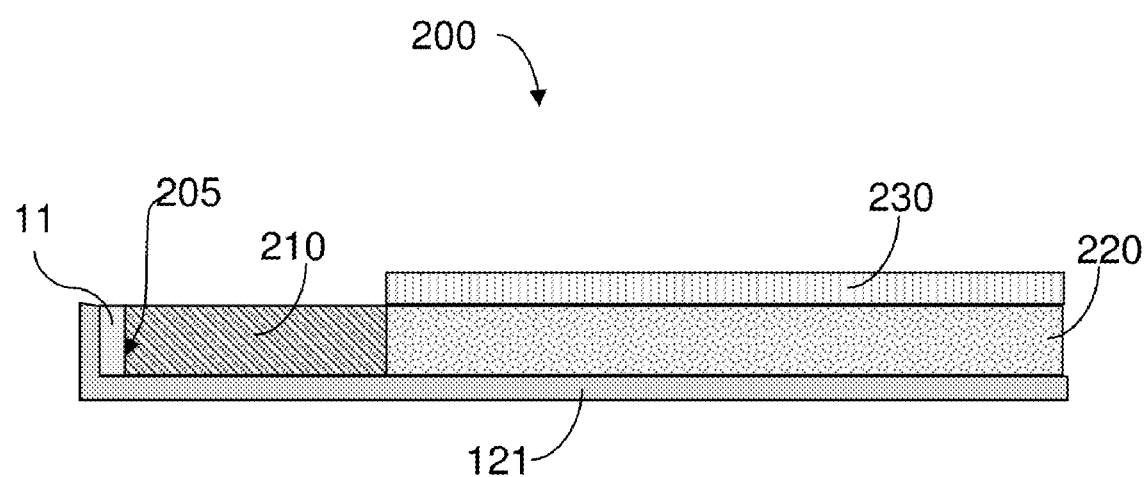
FIG. 6 illustrates an LCD system which includes an assembly of one or more LEDs and a heat pipe, according to one embodiment.

FIG. 6 illustrates a side-view of an LCD system which includes an assembly of one or more LEDs and a thermal management system that can include a heat pipe. The LED(s) and heat pipe assembly may be incorporated into a display system, such as a LCD system. In these embodiments, one or more LEDs may be used as light sources for the LCD system. FIG. 6 shows a cross-section side-view of an LCD system 200 which includes assembly 10 of LED 11 and heat pipe 121. In the illustrative embodiment, one or more LEDs are used for edge illumination of an illumination panel 220. In certain embodiments, illumination panel 220 is a display panel. A topside 205 of the LED(s) is oriented so that light is emitted into mixing region 210. In some cases, the light-emitting device may be directly attached to the mixing region via continuous encapsulation. The mixing region can mix or homogenize incoming light emitted from the LEDs and emit a substantially uniform light output which may be directed into illumination panel 220. Illumination panel 220 may include scattering centers that can output light substantially evenly along its length and into LCD layers 230. LCD layers 230 can pixilate and separate light into colors so as to create images which may be viewed by a user. In other embodiments, LCD layers 230 may be absent and the light-emitting panel assembly may be used as an illumination system for general illumination or any other suitable purpose.

Suitable LCD systems have been described in U.S. Patent Application Publication No. 2006/0043391, entitled "Light Emitting Devices for Liquid Crystal Displays," filed Aug. 23, 2005; U.S. patent application Ser. No. 11/323,176, filed Dec. 30, 2005; and U.S. Patent Application entitled, "LCD Thermal Management Methods and Systems", filed Apr. 28, 2006, which are incorporated herein by reference in their entirety. In some embodiments, high-brightness LEDs and an associated thermal management system can be used in combination with an ultra-thin LCD system. LCD systems presented herein may typically have a thickness of less than 30 mm, less than 10 mm, less than 4 mm, less than 2 mm, or even less than 1 mm. It should be understood that the assemblies described herein can be used in a variety of optical systems other than display systems and illumination systems.

FIGS. 7A-7E show a variety of arrangements of LEDs associated with a display panel. In the embodiment illustrated in FIG. 7A, LCD system 1 includes LCD panel 5 having an illumination area defined by length a, height b, and diagonal c. The LCD can be edge-lit with LEDs positioned on one or more edges of the panel. For example, the LEDs can be positioned on a side edge, a bottom edge, a top edge, or a combination thereof. As shown in the embodiment illustrated in FIG. 7A, LEDs 6 are positioned on both the left and the right sides of the panel. As discussed in more detail below, the number of LEDs associated with a panel, as well as whether the LEDs are positioned on one, or more, edges of a panel, may depend on the size (e.g., area) of the illumination area.

Though the following description is directed to LCD panels, it should be understood that the numbers and dimensions provided below also relate to other optical systems such as illumination systems.

Figure 7A:
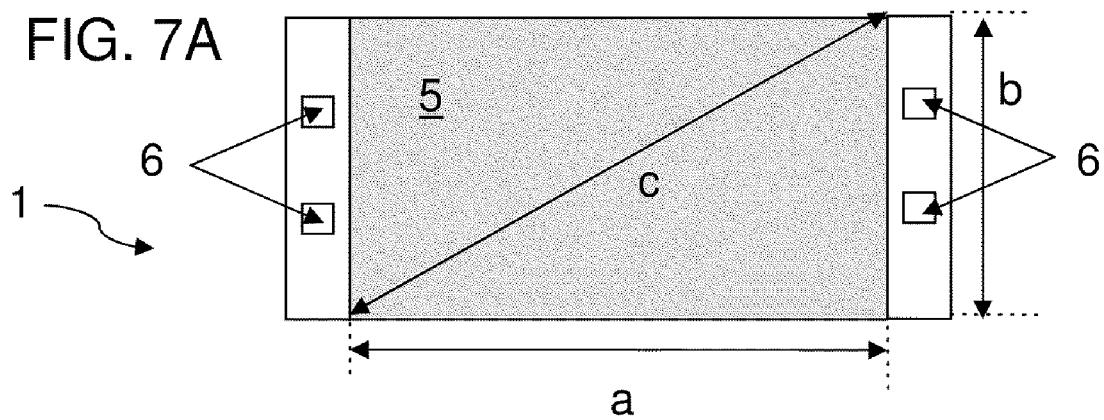
FIGS. 7A-7E show a variety of arrangements of LEDs associated with a display panel, according to one embodiment.
Figure 7B:
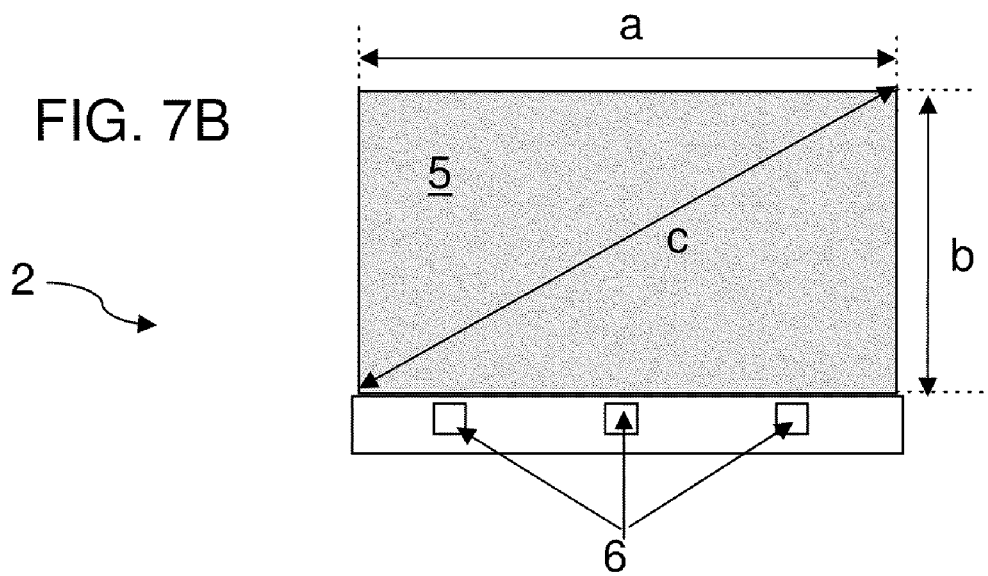

FIG. 7B shows another example of an edge-lit display systems, where LEDs 6 are positioned on a bottom edge of the display panel. In other embodiments, LEDs can be positioned on a top edge of the display panel, or on both the top edge and the bottom edge of the display panel. Different numbers of LEDs can be positioned on an edge of a display panel in an edge-lit system, e.g., depending on the size and/or dimensions of the panel, as described in more detail below.

Figure 7C:
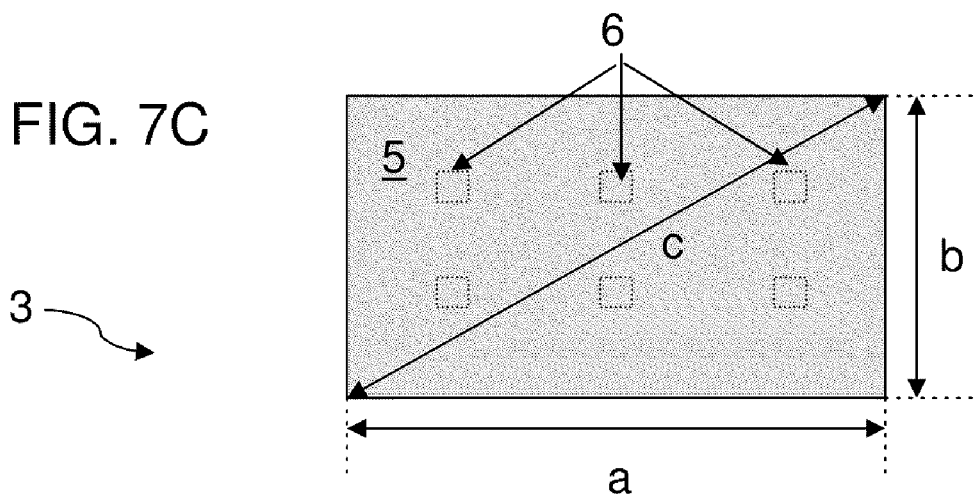

In the embodiment illustrated in FIG. 7C, LCD system 3 includes LEDs 6 positioned behind the LCD. In such a back-lit system, the LEDs illuminate an illumination area of the display from a rear of the LCD. Different numbers of LEDs can be positioned behind a display panel in a back-lit system, e.g., depending on the size and/or dimensions of the panel, as described in more detail below.

Figure 7D:
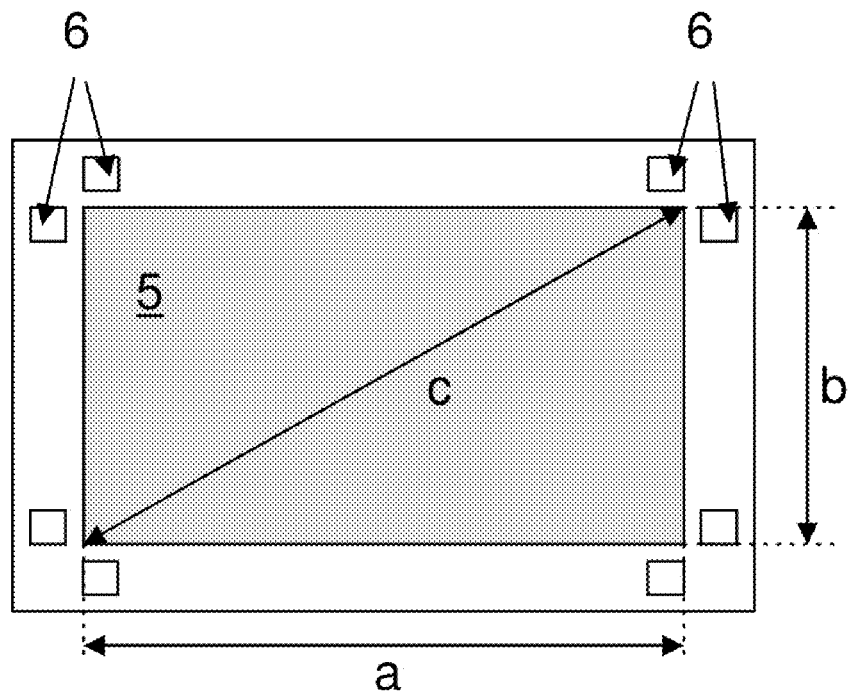
Figure 7E:
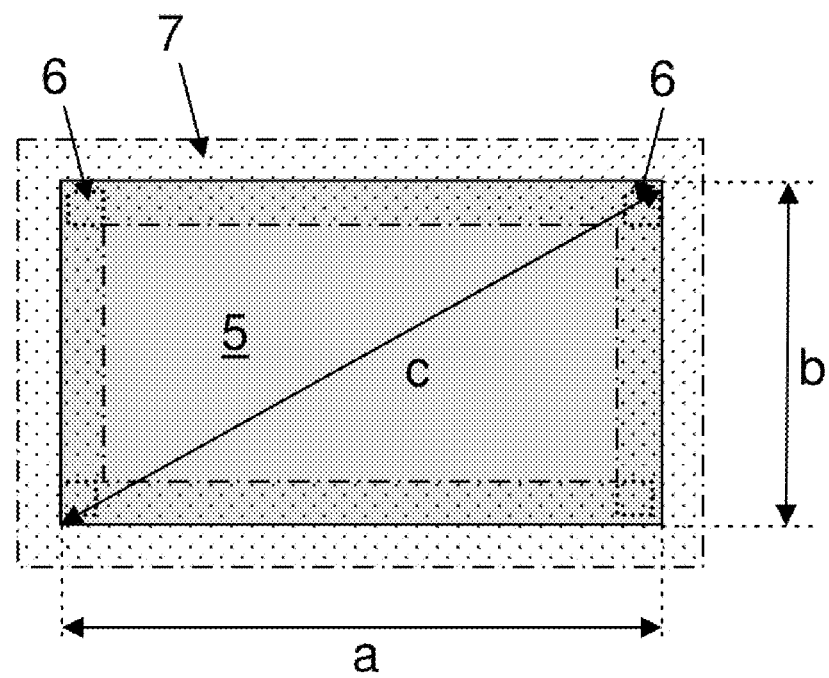

In other embodiments, LEDs 6 can be positioned on or near a corner of the display panel, for example, as shown for display systems 4A and 4B in FIGS. 7D and 7E. In the embodiment illustrated in FIG. 7D, LEDs 6 are positioned outside of the illumination area of the display panel. In the embodiment illustrated in FIG. 7E, LEDs 6 are positioned at the corners inside the illumination area of the display panel. As shown, frame 7 of the display system can cover a portion of the illumination area. Different numbers of LEDs can be positioned on or near a corner of a display panel in a corner-lit system, e.g., depending on the size and/or dimensions of the panel, as described in more detail below. In some embodiments, a single LED is positioned at each corner of the illumination area.

As described above, the systems may be designed to use fewer LEDs than certain existing commercial displays. The systems may utilize the high-brightness LEDs described herein, in combination with the thermal management systems and other components described herein. For instance, in some embodiments, the number of LEDs illuminating a LCD panel may be fewer per unit area of the display panel. For example, the number of LEDs may be less than 300 LEDs per $m^2$ of the illumination area. In other embodiments, the number of LEDs illuminating a LCD panel is less than 200 LEDs per $m^2$, or less than 100 LEDs per $m^2$ of the illumination area. For example, the number of LEDs per $m^2$ of the illumination area may be between 5-100, between 25-100, or between 50-100. The number of LEDs per $m^2$ of the illumination area may depend on factors such as the illumination area and/or the dimensions of the illumination area. Such arrangements of LEDs are applicable to back-lit, edge-lit and corner-lit display systems.

In some embodiments, a single high-brightness LED can illuminate an entire illumination area of a LCD panel. The LCD panel may have an illumination area between 0.01 and 0.16 $m^2$, and the single LED associated with the LCD panel can illuminate a display having a diagonal between, e.g., 7 and 24 inches. For example, the single LED may illuminate a 7 inch panel, a 15 inch panel, a 17 inch panel, a 19 inch panel, or a 24 inch panel.

As used herein, a LCD system including a display panel having a certain diagonal of length c is referred to as an "c inch display"; the display panel is referred to as an "c inch panel". Those of ordinary skill in the art know that display panels having a certain diagonal can have different areas depending on the dimensions of the panel. For example, displays may have different ratios of length-to-width, such as ratios of 16:9 and 4:3. Other ratios are also possible. Accordingly, a display panel having a 7 inch diagonal may have an illumination area of 0.01 $m^2$ for a 16:9 ratio, or an illumination area of 0.015 $m^2$ for a 4:3 ratio. A 15 inch display can have an illumination area of 0.062 $m^2$, corresponding to a 16:9 ratio, or an illumination area of 0.070 $m^2$, which corresponds to a 4:3 ratio. Those of ordinary skill in the art can calculate the illumination area of a display knowing the dimensions of the display and/or the diagonal and the ratio of the length-to-width of the display.

Another embodiment describes a LCD panel having an illumination area between 0.06 and 0.16 $m^2$ and at least one LED associated with the LCD panel such that light emitted from the at least one LED illuminates the LCD panel. The numbers of LEDs required to illuminate such a system may be, in some embodiments, an order of magnitude less than that in certain conventional systems. In some embodiments, the total number of LEDs in such a system is less than 50, less than 40, less than 30, or less than 20. For instance, the total number of LEDs may be between 5-50, between 25-50, or between 5-25. The LCD may have a diagonal between 15 and 24 inches; for example, the LCD may be a 15 inch display, a 17 inch display, a 19 inch display, or a 24 inch display.

Another embodiment describes a LCD panel having an illumination area between 0.16 and 0.6 $m^2$ and at least one LED associated with the LCD panel such that a light emitted from the at least one LED illuminates the LCD panel. In some embodiments, the total number of LEDs in such a system is less than 100, less than 75, less than 50, or less than 20. For instance, the total number of LEDs may be between 5-100, between 25-100, between 50-100, between 75-100, between 2-50, or between 2-25. The LCD may have a diagonal between 24 and 46 inches; for example, the LCD may be a 24 inch display, a 32 inch display, a 42 inch display, or a 46 inch display.

In another embodiment, illumination of large-area displays is provided. High-brightness LEDs are especially suited for large-area displays, as these LEDs enable fewer numbers of LEDs to illuminate such a system, thereby simplifying the system design and lowering the energy required to operate the system. The illumination area of a large-area display may be between, for example, 0.6 and 1.0 $m^2$. The LCD system may have a diagonal between 46 and 60 inches; for example, the LCD may be a 46 inch display, a 50 inch display, a 54 inch display, or a 60 inch display. In some embodiments, the total number of LEDs associated with such displays is less than 300, less than 200, or less than 100. For example, the total number of LEDs in such displays may be between 80-100, between 60-100, between 40-100, between 20-100, or between 10-100. In another embodiment, a LCD panel having an illumination area greater than 0.5 $m^2$ may be illuminated by less than 300, less than 200, or less than 100 LEDs. For example, the total number of LEDs in such displays may be between 80-100, between 60-100, between 40-100, or between 20-100, or between 10-100.

It should be understood that for all of the display systems described above and herein, the display may be back-lit, edge-lit, corner-lit, or a combination thereof.

Those of ordinary skill in the art know that LCD systems, including those described above, can be used in monitors such as computer, laptop, and television monitors.

Using high-brightness LEDs can allow the use of fewer numbers of LEDs for illumination while achieving a brightness comparable to, or exceeding, certain existing display systems of similar size. Accordingly, in certain embodiments, a display may have a brightness of at least 3,000 nits, at least 5,000 nits, at least 10,000 nits, at least 15,000 nits, at least 20,000 nits, or at least 25,000 nits.

In certain embodiments, the LED may emit light having high power. As described in more detail below, the high power of emitted light may be a result of a pattern that influences the light extraction efficiency of the LED. For example, the light emitted by the LED may have a total power greater than 0.5 Watts (e.g., greater than 1 Watt, greater than 5 Watts, or greater than 10 Watts). In some embodiments, the light generated has a total power of less than 100 Watts, though this should not be construed as a limitation of all embodiments. The total power of the light emitted from an LED can be measured by using an integrating sphere equipped with spectrometer, for example a SLM12 from Sphere Optics Lab Systems. The desired power depends, in part, on the optical system that the LED is being utilized within. For example, a display system (e.g., a LCD system) may benefit from the incorporation of high brightness LEDs which can reduce the total number of LEDs that are used to illuminate the display system.

The light generated by the LED may also have a high total power flux. As used herein, the term "total power flux" refers to the total power divided by the emission area. In some embodiments, the total power flux is greater than 0.03 Watts/$mm^2$, greater than 0.05 Watts/$mm^2$, greater than 0.1 Watts/$mm^2$, or greater than 0.2 Watts/$mm^2$. However, it should be understood that the LEDs used in systems and methods presented herein are not limited to the above-described power and power flux values.

Figure 8:
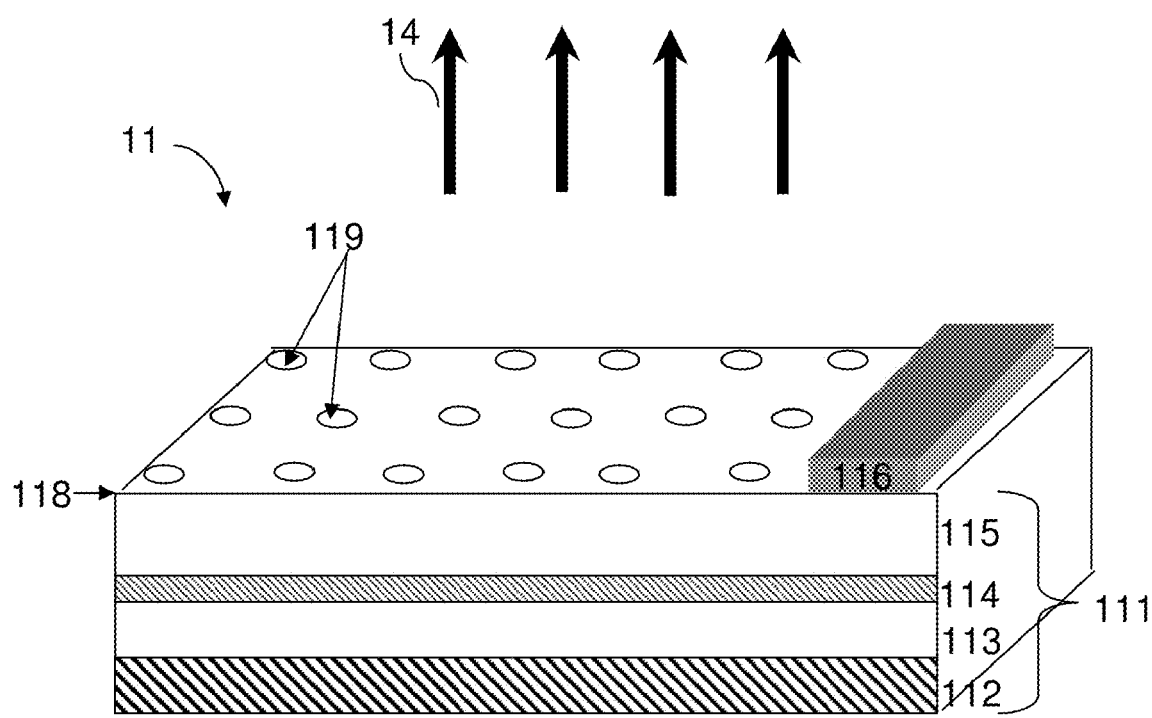
FIG. 8 shows an LED die, according to one embodiment.

FIG. 8 shows an LED die 800 that may be the light-generating component of a packaged LED. It should also be understood that various techniques and embodiments presented herein can also be applied to other light-emitting devices, such as laser diodes. The LED 800 shown in FIG. 8 comprises a multi-layer stack 111 that may be disposed on a sub-mount (not shown). The multi-layer stack 111 can include an active region 114 which is formed between n-doped layer(s) 115 and p-doped layer(s) 113. The stack can also include an electrically conductive layer 112 which may serve as a p-side contact, which can also serve as an optically reflective layer. An n-side contact pad 116 is disposed on layer 115. It should be appreciated that the LED is not limited to the configuration shown in FIG. 8, for example, the n-doped and p-doped sides may be interchanged so as to form an LED having a p-doped region in contact with the contact pad 116 and an n-doped region in contact with layer 112. As described further below, electrical potential may be applied to the contact pads which can result in light generation within active region 114 and emission of at least some of the light generated through an emission surface 118. As described further below, openings 119 may be defined in an interface of the LED through which light may be transmitted (e.g., emission surface 118) to form a pattern that can influence light emission characteristics, such as light extraction and/or light collimation. It should be understood that other modifications can be made to the representative LED structure presented, and that embodiments are not limited in this respect.

The active region of an LED can include one or more quantum wells surrounded by barrier layers. The quantum well structure may be defined by a semiconductor material layer (e.g., in a single quantum well), or more than one semiconductor material layers (e.g., in multiple quantum wells), with a smaller band gap as compared to the barrier layers. Suitable semiconductor material layers for the quantum well structures can include InGaN, AlGaN, GaN and combinations of these layers (e.g., alternating InGaN/GaN layers, where a GaN layer serves as a barrier layer). In general, LEDs can include an active region comprising one or more semiconductors materials, including III-V semiconductors (e.g., GaAs, AlGaAs, AlGaP, GaP, GaAsP, InGaAs, InAs, InP, GaN, InGaN, InGaAlP, AlGaN, as well as combinations and alloys thereof), II-VI semiconductors (e.g., ZnSe, CdSe, ZnCdSe, ZnTe, ZnTeSe, ZnS, ZnSSe, as well as combinations and alloys thereof), and/or other semiconductors.

The n-doped layer(s) 115 can include a silicon-doped GaN layer (e.g., having a thickness of about 300 nm thick) and/or the p-doped layer(s) 113 include a magnesium-doped GaN layer (e.g., having a thickness of about 40 nm thick). The electrically conductive layer 112 may be a silver layer (e.g., having a thickness of about 100 nm), which may also serve as a reflective layer (e.g., that reflects upwards any downward propagating light generated by the active region 114). Furthermore, although not shown, other layers may also be included in the LED; for example, an AlGaN layer may be disposed between the active region 114 and the p-doped layer(s) 113. It should be understood that compositions other than those described herein may also be suitable for the layers of the LED.

As a result of openings 119, the LED can have a dielectric function that varies spatially according to a pattern which can influence the extraction efficiency and collimation of light emitted by the LED. In the illustrative LED 1, the pattern is formed of openings, but it should be appreciated that the variation of the dielectric function at an interface need not necessarily result from openings. Any suitable way of producing a variation in dielectric function according to a pattern may be used. For example, the pattern may be formed by varying the composition of layer 115 and/or emission surface 118. The pattern may be periodic (e.g., having a simple repeat cell, or having a complex repeat super-cell) or non-periodic (e.g., a de-tuned pattern). As referred to herein, a complex periodic pattern is a pattern that has more than one feature in each unit cell that repeats in a periodic fashion. Examples of complex periodic patterns include honeycomb patterns, honeycomb base patterns, (2×2) base patterns, ring patterns, and Archimidean patterns. In some embodiments, a complex periodic pattern can have certain openings with one diameter and other openings with a smaller diameter. As referred to herein, a non-periodic pattern is a pattern that has no translational symmetry over a unit cell that has a length that is at least 50 times the peak wavelength of light generated by active region 114. Examples of non-periodic patterns include aperiodic patterns, quasi-crystalline patterns, Robinson patterns, and Amman patterns.

In some cases, a surface can include random surface roughness patterns. For example, a random surface roughness pattern may include a surface having a root-mean-square (rms) roughness about equal to an average feature size which may be related to the wavelength of the emitted light.

In certain embodiments, an interface of a light-emitting device is patterned with openings which can form a photonic lattice. Suitable LEDs having a dielectric function that varies spatially (e.g., a photonic lattice) have been described in, for example, U.S. Pat. No. 6,831,302 B2, entitled "Light Emitting Devices with Improved Extraction Efficiency," filed on Nov. 26, 2003, which is herein incorporated by reference in its entirety. A high extraction efficiency for an LED implies a high power of the emitted light and hence high brightness which may be desirable in various optical systems.

Figure 9:
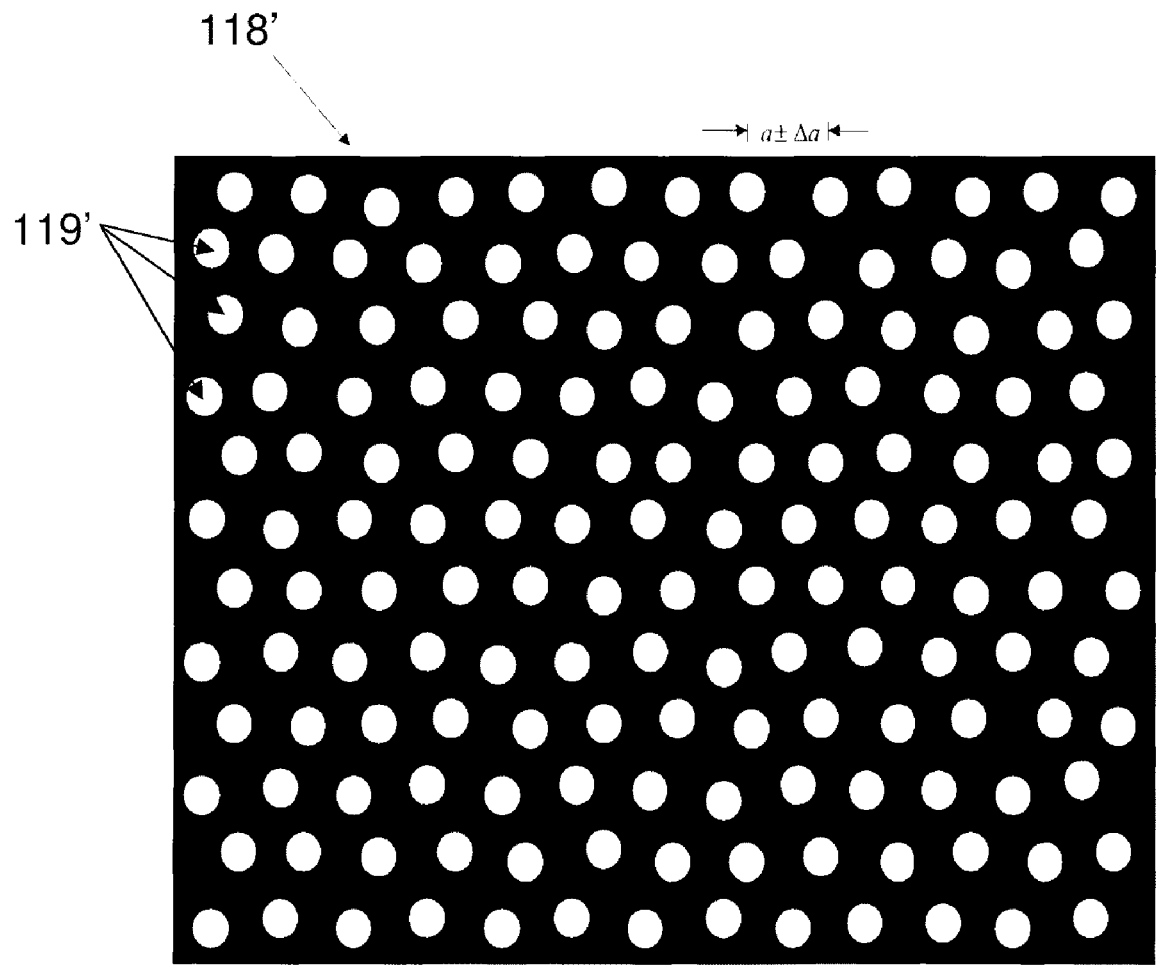
FIG. 9 illustrates a representative LED surface having a dielectric function that varies spatially, according to one embodiment.

FIG. 9 illustrates a representative LED emitting surface 118' having a dielectric function that varies spatially. In this example, the spatial variation of the dielectric function is a result of openings in the emitting surface 118' of the LED. The emitting surface 118' is not flat, but rather consists of a modified triangular pattern of openings 119'. In general, various values can be selected for the depth of openings 119', the diameter of openings 119' and/or the spacing between nearest neighbors in openings 119'. The triangular pattern of openings may be detuned so that the nearest neighbors in the pattern have a center-to-center distance with a value between $(a-\Delta a)$ and $(a+\Delta a)$, where "a" is the lattice constant for an ideal triangular pattern and "$\Delta a$" is a detuning parameter with dimensions of length and where the detuning can occur in random directions. In some embodiments, to enhance light extraction from the LED, a detuning parameter, $\Delta a$, is generally at least about one percent (e.g., at least about two percent, at least about three percent, at least about four percent, at least about five percent) of ideal lattice constant, a, and/or at most about 25% (e.g., at most about 20%, at most about 15%, at most about 10%) of ideal lattice constant, a. In some embodiments, the nearest neighbor spacings vary substantially randomly between $(a-\Delta a)$ and $(a+\Delta a)$, such that pattern of openings is substantially randomly detuned. For the modified triangular pattern of openings 119', a non-zero detuning parameter enhances the extraction efficiency of the LED. It should be appreciated that numerous other modifications are possible to the interfaces (e.g., emitting surface) of an LED while still achieving a dielectric function that varies spatially.

It should also be understood that other patterns are also possible, including a pattern that conforms to a transformation of a precursor pattern according to a mathematical function, including, but not limited to an angular displacement transformation. The pattern may also include a portion of a transformed pattern, including, but not limited to, a pattern that conforms to an angular displacement transformation. The pattern can also include regions having patterns that are related to each other by a rotation. A variety of such patterns are described in U.S. patent application Ser. No. 11/370,220, entitled "Patterned Devices and Related Methods," filed on Mar. 7, 2006, which is herein incorporated by reference in its entirety.

Light may be generated by LED 800 in FIG. 8 as follows. The p-side contact layer 112 can be held at a positive potential relative to the n-side contact pad 116, which causes electrical current to be injected into the LED. As the electrical current passes through the active region, electrons from n-doped layer(s) 115 can combine in the active region with holes from p-doped layer(s) 113, which can cause the active region to generate light. The active region can contain a multitude of point dipole radiation sources that generate light with a spectrum of wavelengths characteristic of the material from which the active region is formed. For InGaN/GaN quantum wells, the spectrum of wavelengths of light generated by the light-generating region can have a peak wavelength of about 445 nanometers (nm) and a full width at half maximum (FWHM) of about 30 nm, which is perceived by human eyes as blue light. The light emitted by the LED (shown by arrows 14) may be influenced by any patterned interface (e.g., the emission surface 118) through which light passes, whereby the pattern can be arranged so as to influence light extraction and collimation.

In other embodiments, the active region can generate light having a peak wavelength corresponding to ultraviolet light (e.g., having a peak wavelength of about 370-390 nm), violet light (e.g., having a peak wavelength of about 390-430 nm), blue light (e.g., having a peak wavelength of about 430-480 nm), cyan light (e.g., having a peak wavelength of about 480-500 nm), green light (e.g., having a peak wavelength of about 500 to 550 nm), yellow-green light (e.g., having a peak wavelength of about 550-575 nm), yellow light (e.g., having a peak wavelength of about 575-595 nm), amber light (e.g., having a peak wavelength of about 595-605 nm), orange light (e.g., having a peak wavelength of about 605-620 nm), red light (e.g., having a peak wavelength of about 620-700 nm), and/or infrared light (e.g., having a peak wavelength of about 700-1200 nm). As described above, display systems may be illuminated by LEDs corresponding to one or more of the above-mentioned ranges.

In some embodiments, the LED may be associated with a wavelength-converting region (not shown). The wavelength-converting region may be, for example, a phosphor region. The wavelength-converting region can absorb light emitted by the light-generating region of the LED and emit light having a different wavelength than that absorbed. In this manner, LEDs can emit light of wavelength(s) (and, thus, color) that may not be readily obtainable from LEDs that do not include wavelength-converting A regions.

The techniques presented herein can also provide a suitable thermal management system to facilitate conduction and dissipation of heat produced by LEDs. Referring back to FIG. 6, in the illustrative embodiment, heat pipe 121 extends across a back surface of the LCD system. In some embodiments, a support structure (not shown) may be positioned between the heat pipe and the illumination panel 230 and/or mixing region, though it should be understood that in other embodiments a separate support structure may not necessarily be present. The heat pipe can be attached to the illumination panel or support (when present) or it can be spaced away from the illumination panel or support in order to facilitate heat removal with the ambient. The embodiments are not limited to configurations wherein the heat pipe wraps around the backside of the light panel. In one embodiment, the heat pipe could be incorporated around the edges of the panel and/or integrated with a frame encasing the edges of the panel. The heat pipe may be in thermal contact with protrusions to aid in heat exchange. It should be understood that one or more heat pipes may be used per light-emitting device.

The support (e.g., a back-plate), when present, may be in thermal contact with the heat pipe and can additionally act as a heat sink for the LEDs. Thus, the support may further aid in the removal of heat from within the display. The support may also include a reflective layer to help guide light propagating in panel 220 towards the emission surface (e.g., towards LCD layers 230). Typical materials that may form the support include aluminum, aluminum alloys, steel, or combinations thereof.

In some embodiments, the ability to remove heat from the LED can enable operation at high power levels (e.g., light-emitting devices having a total output power of greater than 0.5 Watts), as previously described. In some embodiments, the thermal management system can effectively dissipate at least 5 W, at least 10 W, at least 20 W. Due to potential for high output power light emission (i.e., high brightness) from the LEDs, the number of light-emitting devices that are used per unit length of the illumination panel may be reduced. In one embodiment, a high brightness light-emitting device can be used to edge illuminate an illumination panel length of about 2 inches or greater (e.g., greater than 4 inches, greater than 6 inches). In some such embodiments, the high brightness LED (s) has an emission power of greater than about 0.5 W and may include a plurality of LEDs that may have different color light emission, for example a red light-emitting die, a blue light emitting die, and a green light-emitting die.

Figure 10:
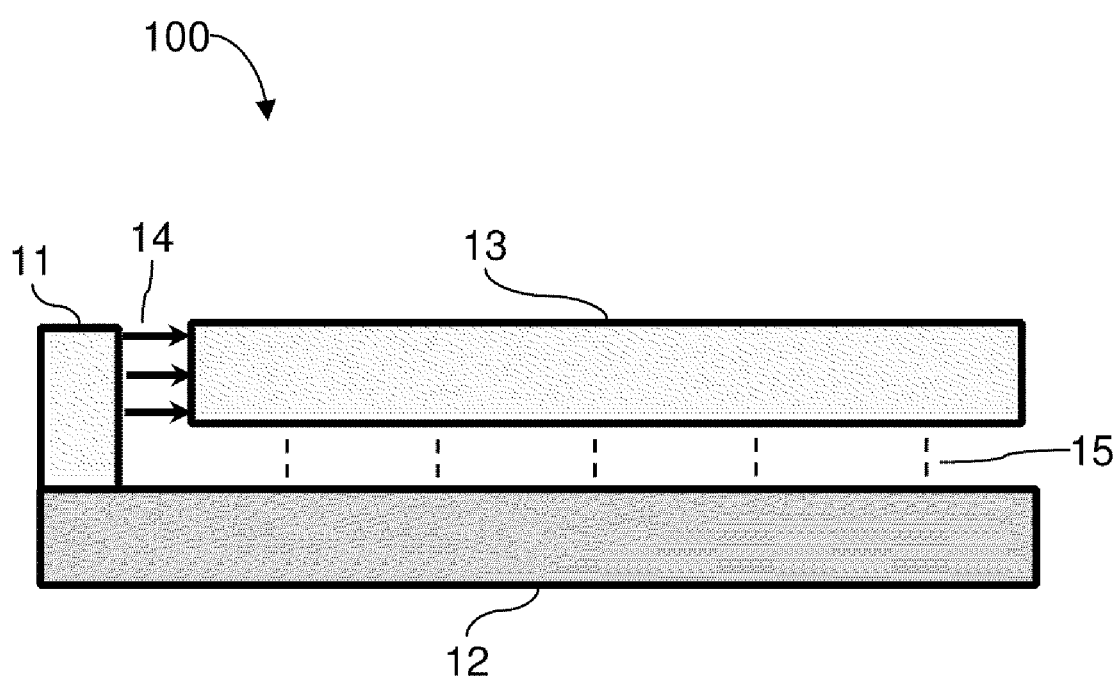
FIG. 10 shows an optical system including an LED supported by a thermal management system and optically coupled to an optical component, according to one embodiment.

FIG. 10 shows another example of an optical system associated with a thermal management system. FIG. 10 shows an optical system 100 that includes an LED 11 supported by a thermal management system 12, where the LED 11 is optically coupled to an optical component 13. In some embodiments, optical system 100 may be a display system, such as an LCD system. In other embodiments, optical system 100 may be an illumination system, such as an illumination panel.

Thermal management system 12 may include passive and/or an active heat exchanging mechanisms. In some embodiments, the thermal management system 12 can include one or more heat pipes, a heat sink, a thermal electric cooler, a fan, and/or a circulation pump. In some embodiments, thermal management system 12 may also facilitate the conduction and dissipation of heat generated within the optical component 13, as depicted schematically by dashed lines 15. Such cooling may be accomplished via thermal communication (e.g., thermal contact) between the optical component 13 and the thermal management system.

As described in more detail below, optical component 13 of FIG. 10 may include one or more components composed of material(s) that can transmit, diffuse, homogenize, and/or emit some or all of the light transmitted therein. Optical component 13 may be arranged so that at least some light 14 emitted from the LED enters the optical component 13. In some embodiments, optical component 13 may include scattering centers that can diffuse, scatter, homogenize, and/or emit some or all of the light transmitted therein so that light may exit along some or all of the length of the optical component 13. As discussed further below, the optical component may be an LCD panel.

FIGS. 11A-11D illustrate embodiments of thermal management systems including one or more heat pipes. Generally, a thermal management system may include a suitable system that can conduct and dissipate heat which may be generated within devices and components of the optical system. Devices that generate heat may include LEDs, especially high brightness LEDs, and components of an optical system, as described previously. In one embodiment of a display system, an optical component which may generate and/or transmit heat is an illumination panel which may be disposed underneath display layers, such as a liquid crystal optical film or a liquid crystal spatial light modulator (not shown). In some embodiments, a thermal management system may be characterized by, or may include one or more components that are characterized by, a thermal conductivity greater than 5,000 W/mK, greater than 10,000 W/mK, and/or greater than 20,000 W/mK. In some embodiments, the thermal conductivity lies in a range between 10,000 W/mK and 50,000 W/mK (e.g., between 10,000 W/mK and 20,000 W/mK, between 20,000 W/mK and 30,000 W/mK, between 30,000 W/mK and 40,000 W/mK, between 40,000 W/mK and 50,000 W/mK).

In some embodiments, a thermal management system can include passive and/or active heat exchanging mechanisms. Passive thermal management systems can include structures formed of one or more materials that rapidly conduct heat as a result of temperature differences in the structure. Thermal management systems may also include one or more protrusions which can increase the surface contact area with the surrounding ambient and therefore facilitate heat exchange with the ambient. In some embodiments, a protrusion may include a fin structure that may have a large surface area.

In a further embodiment, a thermal management system can include channels in which fluid (e.g., liquid and/or gas) may flow so as to aid in heat extraction and transmission. For example, the thermal management system may comprise a heat pipe to facilitate heat removal. Various heat pipes are well known to those in the art, and it should be understood that the embodiments presented herein are not limited to merely such examples of heat pipes. Heat pipes can be designed to have any suitable shape, and are not necessarily limited to only cylindrical shapes. Other heat pipe shapes may include rectangular shapes which may have any desired dimensions.

In some embodiments, one or more heat pipes may be arranged such that a first end of the heat pipes is located in regions of the optical system that are exposed to high temperatures, such as in proximity to one or more LEDs in the optical system. A second end of the heat pipes (e.g., a cooling end) may be exposed to the ambient. The heat pipes may be in thermal contact with protrusions to aid in heat exchange with the ambient by providing increased surface area. Since heat pipes may have a thermal conductivity that is many times greater (e.g., 5 times greater, 10 times greater) than the thermal conductivity of many metals (e.g., copper), the conduction of heat may be improved via the incorporation of the heat pipes into optical systems, such as display and illumination systems.

Active thermal management systems may include one or more suitable means that can further aid in the extraction and transmission of heat. Such active thermal management systems can include mechanical, electrical, chemical and/or any other suitable means to facilitate the exchange of heat. In one embodiment, an active thermal management system may include a fan used to circulate air and therefore provide cooling. In another embodiment, a pump may be used to circulate a fluid (e.g., liquid, gas) within channels in the thermal management system. In further embodiments, the thermal management system may include a thermal electric cooler that may further facilitate heat extraction.

Figure 11A:
FIGS. 11A-11D illustrate a thermal management system comprising a heat pipe, which may be part of an optical system, according to one embodiment.

FIG. 11A illustrates a thermal management system including a heat pipe 121 which may be part of an optical system, such as a display or illumination system. The heat pipe may be in thermal contact with one or more LEDs, so that heat generated within the LED may be readily transmitted along the heat pipe. Heat transmitted along the heat pipe may be transferred to the surrounding ambient and/or transferred to surrounding heat exchanging components. Examples of heat exchanging elements can include protrusions which may have increased surface area and therefore may aid in the transfer of heat to the surrounding ambient, as described further below. Heat pipe 121 may also be electrically conductive and one or more LEDs supported by the heat pipe may be electrically connected to the heat pipe. LED dies, such as those illustrated in FIG. 8, may be mounted on the heat pipe 121 so that the LED conductive layer 112 is electrically connected to heat pipe 121 through an electrically conductive attachment material. In some embodiments, one or more LEDs are mounted on a heat pipe with a thermally conductive attachment material, such as a thermally conductive epoxy.

Figure 11B:
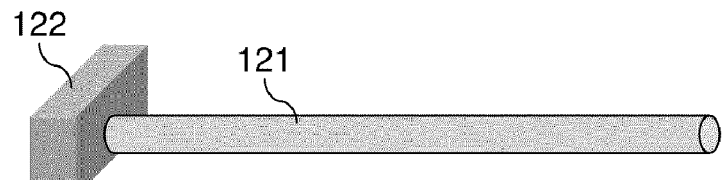

FIG. 11B illustrates another thermal management system that includes a heat pipe 121 in thermal contact with an interposer component 122. The interposer component 122 may be formed of a material that possesses a high thermal conductivity, such as copper. In some embodiments, the interposer component may support one or more LEDs, as discussed further below. Interposer component 122 may also be electrically conductive and one or more of the LEDs may be electrically connected to the interposer component 122. LED dies, such as those illustrated in FIG. 8, may be mounted on the interposer component so that the LED conductive layer 112 is electrically connected to the interposer component 122. In some embodiments, one or more LEDs are mounted on the interposer component with a thermally conductive attachment material, such as a thermally conductive epoxy.

Figure 11C:
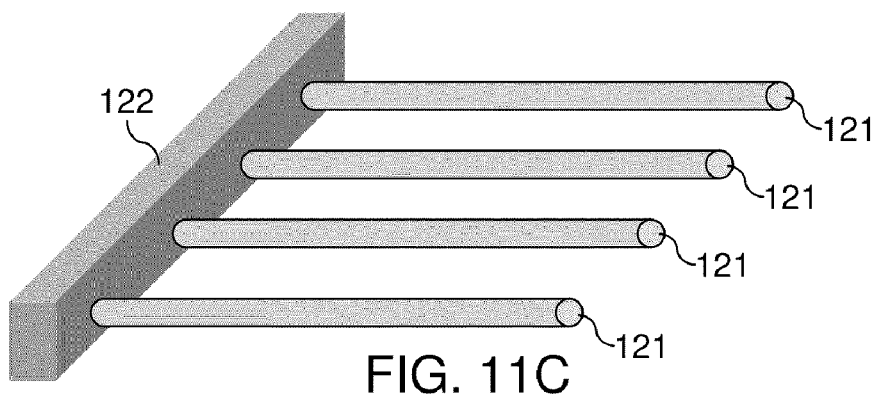

FIG. 11C illustrates another thermal management system that includes a plurality of heat pipes. In some embodiments, at least some of the heat pipes can have differing thermal conductances. Differing thermal conductances may be achieved by varying the size of heat pipe and/or internal composition. In the illustration of FIG. 11C, the heat pipes 121 are arranged to form an array, which may be such that the heat pipes are substantially parallel. It should be understood that in other arrays, the heat pipes may have any relative orientation, and are not necessarily parallel. In some embodiments, a plurality of heat pipes may be arranged to be parallel to an optical component of an optical system. In some embodiments, where the optical component comprises an illumination component, such as an illumination panel of a display system or an illumination system, the plurality of heat pipes may be arranged to be disposed underneath a portion or substantially all of the illumination panel. For example, the array of heat pipes may be disposed beneath at least 50% (e.g., at least 75%, at least 90%) of the area of the illumination panel. Such an arrangement may be desirable in display systems having thermal management systems that can extract and dissipate heat generated by LEDs and/or other components that form the display system. In some embodiments, as illustrated in FIG. 11C, an interposer component 122 may be in thermal contact with a plurality of heat pipes. Furthermore, LEDs may be supported by the interposer component 122, as described in relation to FIG. 11B.

Figure 11D:
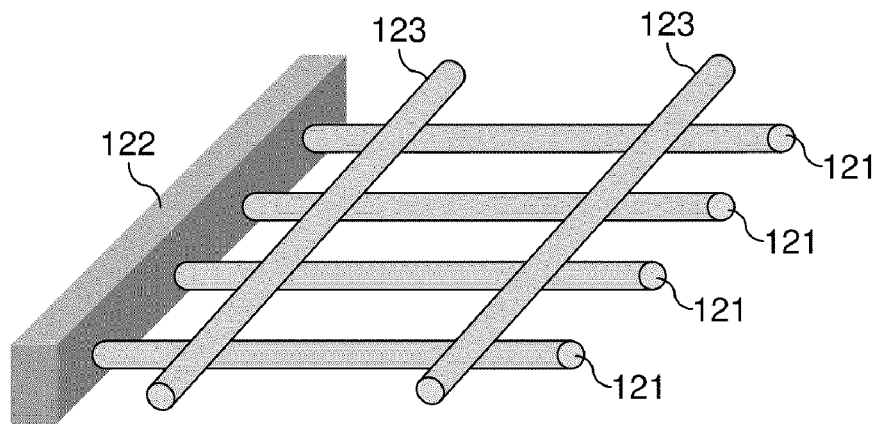

FIG. 11D illustrates another thermal management system that includes an array of heat pipes further arranged so that two or more of the heat pipes partially overlie each other. As in the embodiment illustrated in FIG. 11C, a plurality of heat pipes 121 may be arranged in a desired configuration, for example a substantially parallel configuration. Furthermore, one or more heat pipes 123 may be arranged to at least partially overlie some or all of the heat pipes 121. The heat pipes that overlie each other may be arranged to have any desired angle of intersection, for example, the heat pipes that overlie each other may be substantially perpendicular, parallel, or form any other angle. Heat pipes 123 may be in thermal contact with some or all of the heat pipes 121. Thermal contact may be achieved via an attachment material between the heat pipes that overlie each other. The attachment material may be a suitably thermally conductive attachment material, such as a solder. Such an arrangement may be desirable when an optical component disposed over the thermal management system possesses regions that may have a higher operating temperature than other regions. For example, a mixing region within an illumination panel component or optically coupled to an illumination panel (in a display system or illumination system) may be at a higher operating temperature than other regions of the illumination panel. As such heat pipes (such as heat pipes 123) may be arranged be lie substantially underneath the mixing regions of the illumination panel and therefore may facilitate the extraction of heat from those higher temperature regions of the illumination panel.

Figure 12A:
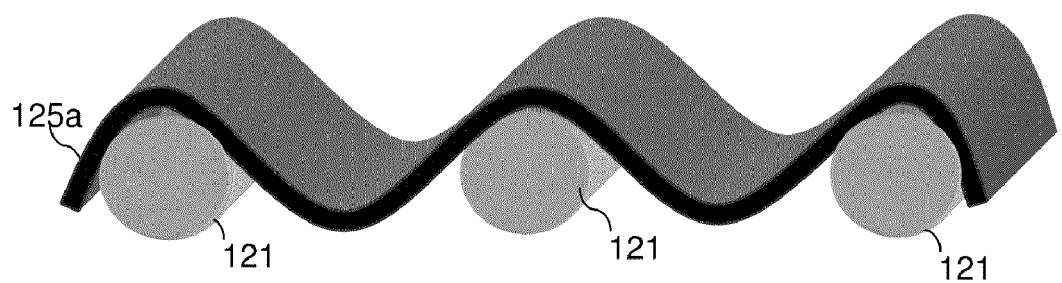
FIGS. 12A-12C show thermal management systems including heat pipes in thermal contact with at least one protrusion, according to one embodiment.
Figure 12B:
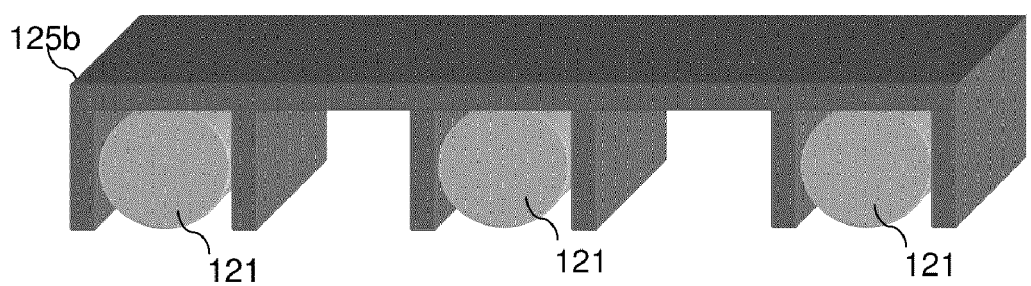
Figure 12C:
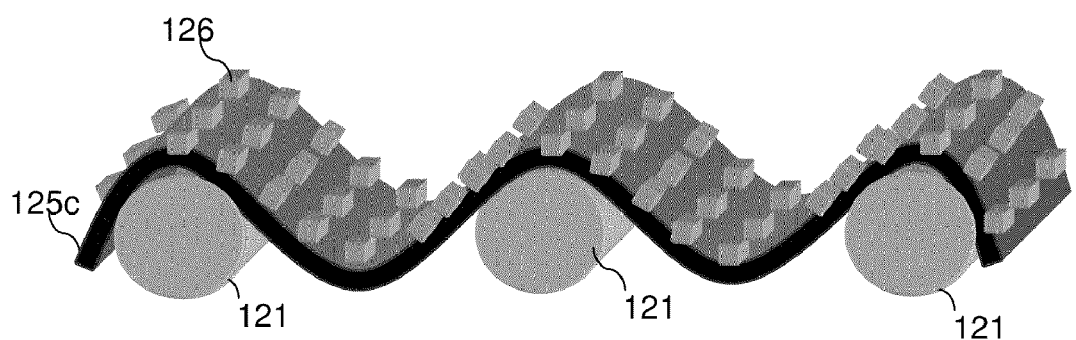

FIGS. 12A-12C illustrate embodiments of thermal management systems including heat pipes in thermal contact with at least one protrusion. In some embodiments, the heat pipes can be in direct or thermal communication with at least one protrusion. One or more heat pipes can be in direct thermal communication with a plurality of protrusions which can form a heat sink. Protrusions can have any desired shape and can include suitable structures having increased surface contact area with the surrounding ambient, as compared to heat pipes by themselves. As a result of the increased surface area, the protrusions may therefore facilitate heat exchange with the ambient. In some embodiments, a protrusion may include a fin structure that may have a large surface area. The fin structure may be formed of a thermally conductive material having a suitably high thermal conductivity, such as copper and/or aluminum. FIG. 12A illustrates an embodiment of a thermal management system wherein a plurality of heat pipes 121 are in thermal contact with a fin 125a. In this illustrative embodiment, the fin 125a has a wave-like shape and can readily accommodate heat pipes having a variety of different cross-section sizes (e.g., different diameters).

One or more heat pipes may be fixed to one or more protrusions (e.g., fins) with a suitable attachment material, including solder (e.g., an alloy between two or more metals such as gold, germanium, tin, indium, lead, silver, molybdenum, palladium, antimony, zinc, etc.), metal-filled epoxy, thermally conductive adhesives (such as those offered by Diemat, Inc. of Byfield, Mass.), metallic tape, thermal grease, and/or carbon nanotube-based foams or thin films. Thermally conductive attachment materials typically have a suitably high thermal conductivity and therefore a low thermal resistance per unit contact area.

It should be appreciated that a variety of fin structures are possible which may have increased surface area, and embodiments are not limited to the wave-like fin structure illustrated in FIG. 12A. FIG. 12B illustrates a fin structure 125b having rectangular-shaped compartments within which heat pipes 121 may be disposed. The heat pipes may be in thermal contact with one or more sides of the rectangular compartments. In the illustrated embodiment, the heat pipes are in contact with all the sides of the rectangular compartments, although other embodiments are not necessarily limited in this respect.

In some embodiments, a protrusion, for example a fin, may have a portion or all of its surface textured. The surface texture may comprise dimples, grooves, corrugated patterns, and/or pin-like extensions. Textured surfaces may improve heat transfer to the surrounding ambient by increasing contact area with the ambient. Also, some textured surfaces, such as a dimpled surface, may reduce the air resistance of the surface by creating small air pockets during air flow across the surface. Additionally, or alternatively, protrusions (e.g., a fin), may include surface coatings that can reduce the air resistance of the surface and thereby allow air to freely flow across the surface and remove heat therefrom via convection. FIG. 12C illustrates an embodiment of a fin 125c having a textured surface comprising a corrugated pattern 126.

Figure 13A:
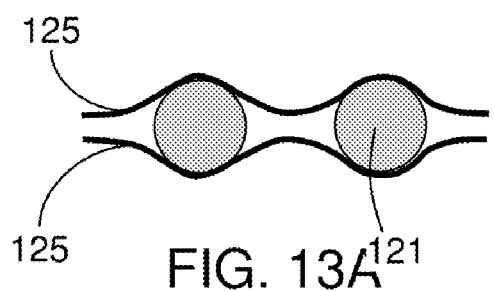
FIGS. 13A-13F illustrate thermal management systems including heat pipes in thermal contact with a plurality of protrusions, according to one embodiment.
Figure 13B:
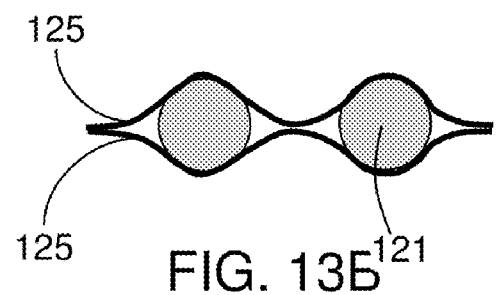
Figure 13C:
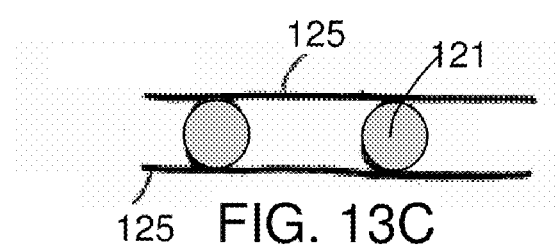
Figure 13D:
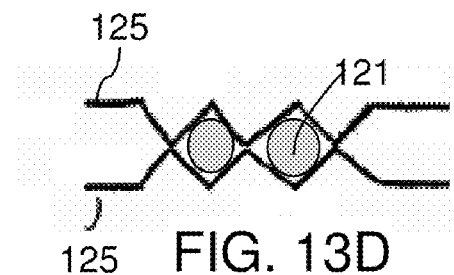

FIGS. 13A-13F illustrate embodiments of thermal management systems including heat pipes in thermal contact with a plurality of protrusions. Protrusions, such as fins, may be stacked so as to form multiple layers. In some embodiments, fins can also be bent or shaped into any desired configuration. Multiple heat pipes can be placed between two or more fin layers to increase the removal of heat from the optical system (e.g., as shown in FIGS. 13A, 13B and 13C). Fins may be formed of materials that can be readily shaped to the contours of the heat pipes. As illustrated in FIG. 13A, two fins 125 may be partially shaped around heat pipes 121 but the fins need not necessarily be in contact with each other. Also, as shown in the illustration of FIG. 13B, two fins may be contacted in some regions and/or not contacted in other regions. Furthermore, as shown in FIG. 13C, the fins may be substantially straight and need not necessarily be shaped to the contours of the heat pipes. Also, as shown in FIG. 13D, the fins may be shaped to have cornered edges so that heat pipes may readily be placed within the cornered portions of the fins.

Figure 13E:
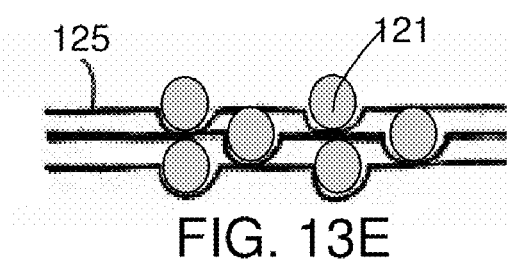
Figure 13F:
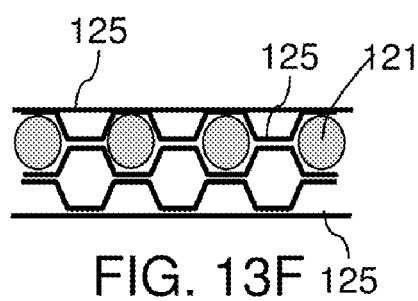

In some embodiments, as shown in FIGS. 13E and 13F, multiple layers of fins may be arranged to accommodate multiple heat pipes. FIG. 13E illustrates an embodiment where multiple layers of fins house heat pipes on each layer. In some embodiments, multiple layers of fins may be shaped into a honeycomb geometric configuration, as illustrated in FIG. 13F. Such a configuration can increase the surface area of the fins, thereby increasing the effectiveness of transferring to the surrounding ambient. In some embodiments, strategically placing heat pipes across the back of an illumination panel of a display system can provide a uniform distribution of heat and can improve the operation of the display system. The heat pipes and/or protrusions may extend across and traverse one side of an optical component, such as a backside of an illumination panel (e.g., in a display system and/or an illumination system).

Figure 14A:
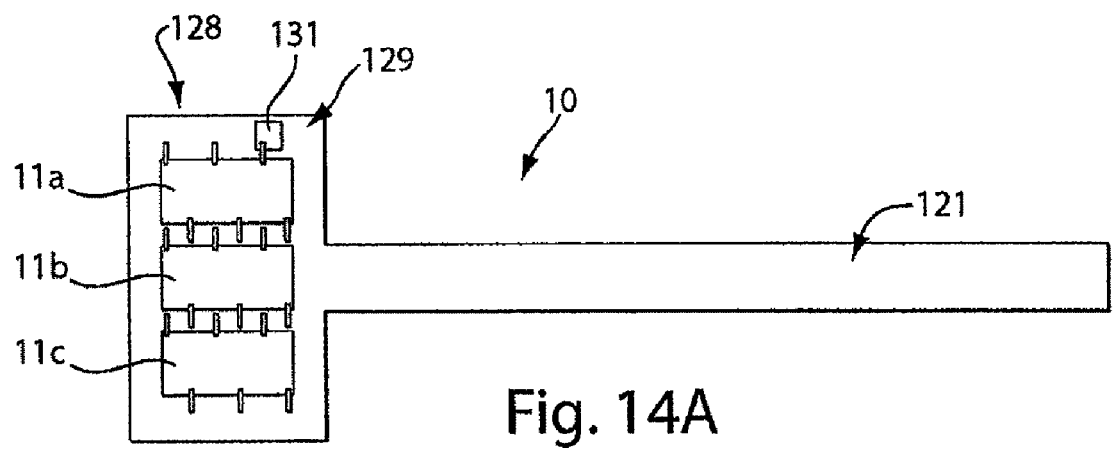
FIGS. 14A-14C show views of an assembly that includes LED(s) supported by a heat pipe, according to one embodiment.

As previously described, an optical system may include an LED supported by a thermal management system, where the thermal management system may include a heat pipe. In other embodiments, a plurality of LEDs may be supported by a heat pipe. FIG. 14A illustrates a top-view of an assembly that includes a plurality of LEDs supported by a heat pipe. Assembly 10 includes LEDs 11a, 11b, 11c supported by a heat pipe 121 according to an embodiment. In some embodiments, each of the LEDs 11a, 11b, and 11c include a red-emitting LED die associated with a green-emitting LED die and a blue-emitting LED die. It should be understood that although LEDs 11a, 11b, and 11c are shown in this embodiment, in other instances, each of the embodiments 11a, 11b, and 11c may be LED dies, and that embodiments are not limited in this respect.

Figure 14B:
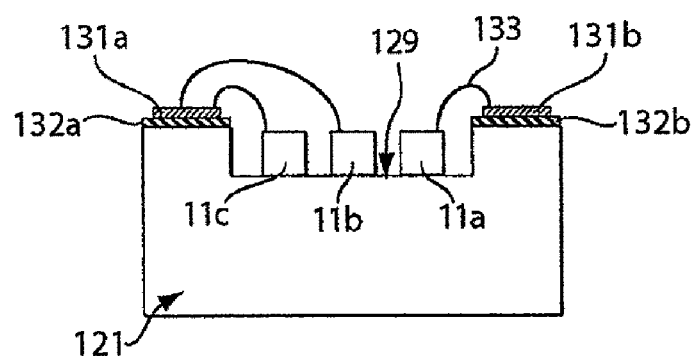

As shown, the LEDs are supported at a first end 128 of the heat pipe which includes a flattened region 129 which can facilitate mounting of the LEDs and/or can increase the surface area between the heat pipe and LEDs. However, it should be understood that the LEDs may be positioned at any location on the heat pipe including along its length. As shown in FIG. 14B, which is a side-view of an assembly that includes a plurality of LEDs supported by a heat pipe, a cavity may be formed at the first end 128 of the heat pipe, within which the LEDs may be embedded or housed. In such a configuration, the heat pipe can act as the submount for the LEDs. Electrical connections to the LEDs may be achieved via a variety of configurations. In some embodiments, as illustrated in FIGS. 14A and 14B, one or more electrical contacts 131a and 131b can be disposed adjacent the LEDs, while being supported by the heat pipe. An electrically insulating layer 132 may be disposed between the electrical contacts 131 and the heat pipe. The electrical contacts 131 may be connected to an external voltage source (not shown). In some embodiments, the electrical contacts 131a and 131b are connected to the same voltage source, whereas in other embodiments, the electrical contacts 131a and 131b are connected to different voltage sources, thereby enabling the control of electrical power that is supplied to individual LEDs. In such arrangements, one or more LEDs may be driven by different voltage sources, where the driving voltage may be based on a desired light output power for each LED in the assembly. One or more temperature sensors may be incorporated in the assembly to provide a measurement representative of the temperature of the assembly and/or of an optical component (e.g., an illumination panel) which is illuminated by the assembly. A control system (not shown) can receive one or more input signals representative of one or more temperature sensor measurements, and can output one or more signals that can control light emission from the LEDs, for example via the adjustment of the driving voltage supplied to each LED.

Wire connectors 133 may electrically connect the electrical contacts 131 to contact pads (not shown) on the LEDs so as to provide drive voltages to the LEDs. For example, when the LEDs are similar to the representative LED illustrated in FIG. 8, the wire connectors 133 may be connected to contact pad 116 (e.g., n-side contact pad). In such a configuration, the LED backside may be such that conductive layer 112 of the LED, as illustrated in FIG. 8, may be in electrical contact with the heat pipe. Since the heat pipe may be electrically conductive, the heat pipe itself can serve as an electrical contact to the LEDs having a polarity opposite to the electrical contacts 131. For example, the electrical contacts 131 may serve as n-side contacts and the heat pipe may serve as a p-side contact. Advantageously, this design may be such that the heat pipe, upon which one or more LEDs may be supported, provides both electrical connections to the LEDs as well as means for heat to be transferred away from the LEDs.

A suitable electrical connection between the backside of the LEDs and the heat pipe may be formed using an electrically conductive attachment material. Electrically conductive attachment materials can include solder. In some embodiments, the attachment material is thermally conductive and typically has a suitably high thermal conductivity.

Figure 14C:
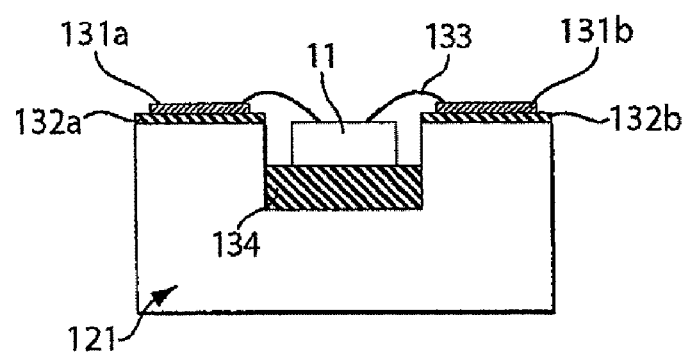

FIG. 14C shows another embodiment in which an electrically insulating layer 134 is positioned between the heat pipe and an LED 11. In some embodiments, the electrically insulating layer 134 may be substantially thermally conductive. For example, the electrically insulating layer 134 may comprise aluminum nitride and/or a thermally conductive epoxy, though it should be understood that other electrically insulating materials may also be suitable. In the illustrative embodiment of FIG. 14C, electrical contact 131a may be electrically connected to an n-side contact pad of the LED and electrical contact 131b may be electrically connected to a p-side contact pad of the LED. In some embodiments, it may be desirable for the LED to have exposed n-side and p-side contact pads that may be readily electrically connected to via top-side wire bonds.

In general, heat pipe 121 may have any suitable configuration. For example, the heat pipe can include an outer wall (which may be tubular at least in some portions of the heat pipe) or housing that is configured to enclose a core, also known as a wick (not shown). The heat pipe can also house heat transfer fluid, such as water, that aids in the transfer of heat away from the LED. Heat pipes that incorporate fluid can be highly efficient heat exchangers due to the water undergoing a condensation and evaporation cycle, thereby rapidly transferring heat away from the LED.

In some embodiments, a heat pipe on which one or more LEDs are supported can include two sections. A first section may include the first end 128 on which the LEDs may be supported and a second section may include the tubular portion of the heat pipe. The first portion may be threadly coupled to the tubular portion of the heat pipe, although it should be appreciated that the first portion may be coupled to the tubular portion in any other suitable manner.

In another embodiment, an interposer component may be disposed between the LED and the heat pipe. The interposer component can allow for other heat pipes to connect thereto, as illustrated in FIGS. 11C-11D. Connecting multiple heat pipes together through an interposer component can create a heat pipe/heat exchanging network, whereby a uniform heat distribution network may be formed. Such a network can be advantageous were one LED is emitting more heat than the other LEDs at other locations on the network. The network can allow for the excess heat to be distributed uniformly across the whole network. In such at network as previously described the heat pipes can be interconnected with interposer components located near the LEDs or at the opposite end of the heat pipe.

Figure 15A:
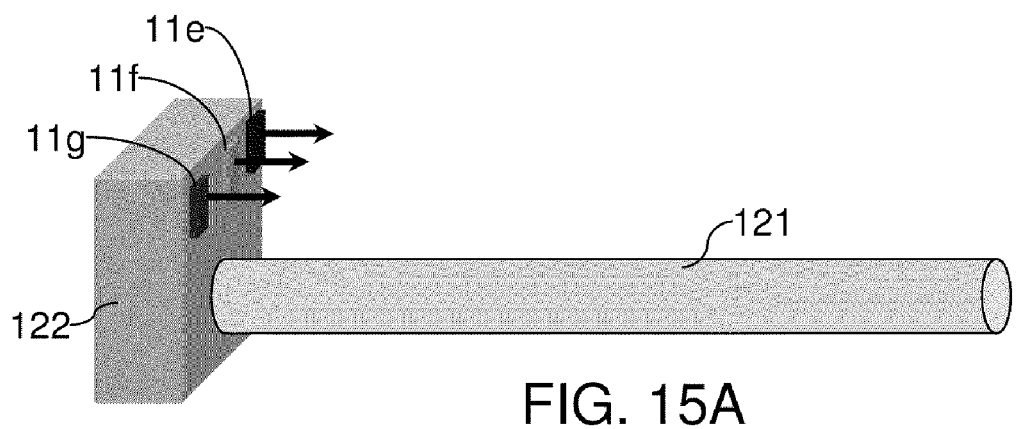
FIGS. 15A-15B illustrate assemblies that can include a plurality of LEDs supported by a heat pipe, according to one embodiment.
Figure 15B:

FIGS. 15A and 15B illustrate other assemblies that can include a plurality of LEDs supported by a heat pipe, wherein light emission from the LEDs is substantially parallel to the heat pipe length. In such configurations, LEDs (e.g., 11e, 11f, 11g) are supported by at least one heat pipe 121 so that light emission from the LEDs is substantially parallel to the length of the heat pipe. Such a configuration may be desirable when incorporating LEDs with a thermal management system, including at least one heat pipe, in an optical system such as a display system or illumination panel. FIG. 15A shows LEDs mounted on an interposer component 122 connected to a heat pipe 121. FIG. 15B shows LEDs mounted on a heat pipe 121 having a substantially flattened end 128. The flattened end 128 of the heat pipe may be such that the surface normal of the flattened end may be substantially parallel to the length of the tubular portion of the heat pipe.

Figure 16A:
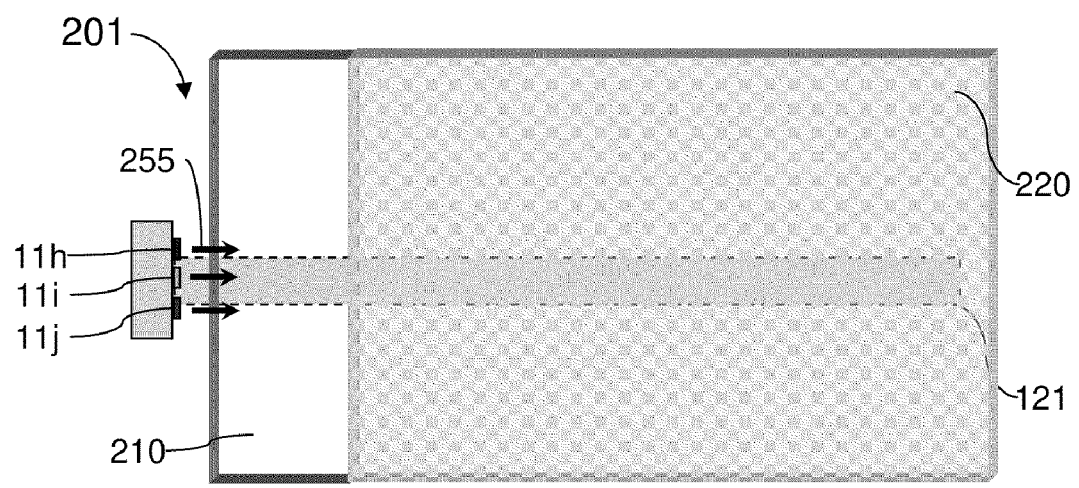
FIG. 16A shows an edge-lit LCD system including LEDs and a heat pipe assembly, according to one embodiment.
Figure 16B:
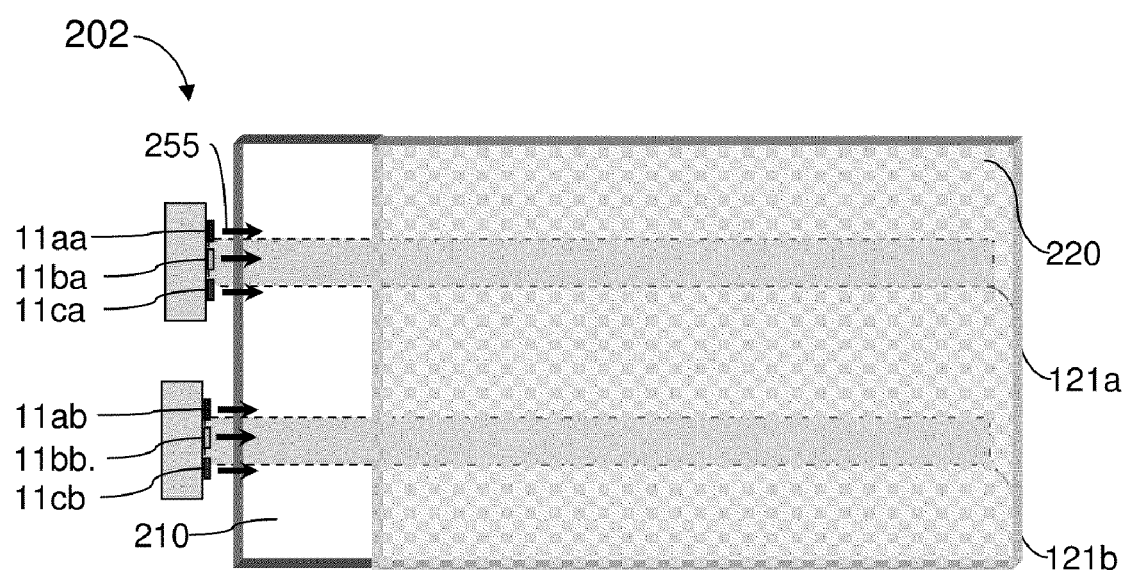
FIG. 16B shows an edge-lit LCD system including LEDs and a plurality of heat pipe assemblies, according to one embodiment.
Figure 16C:
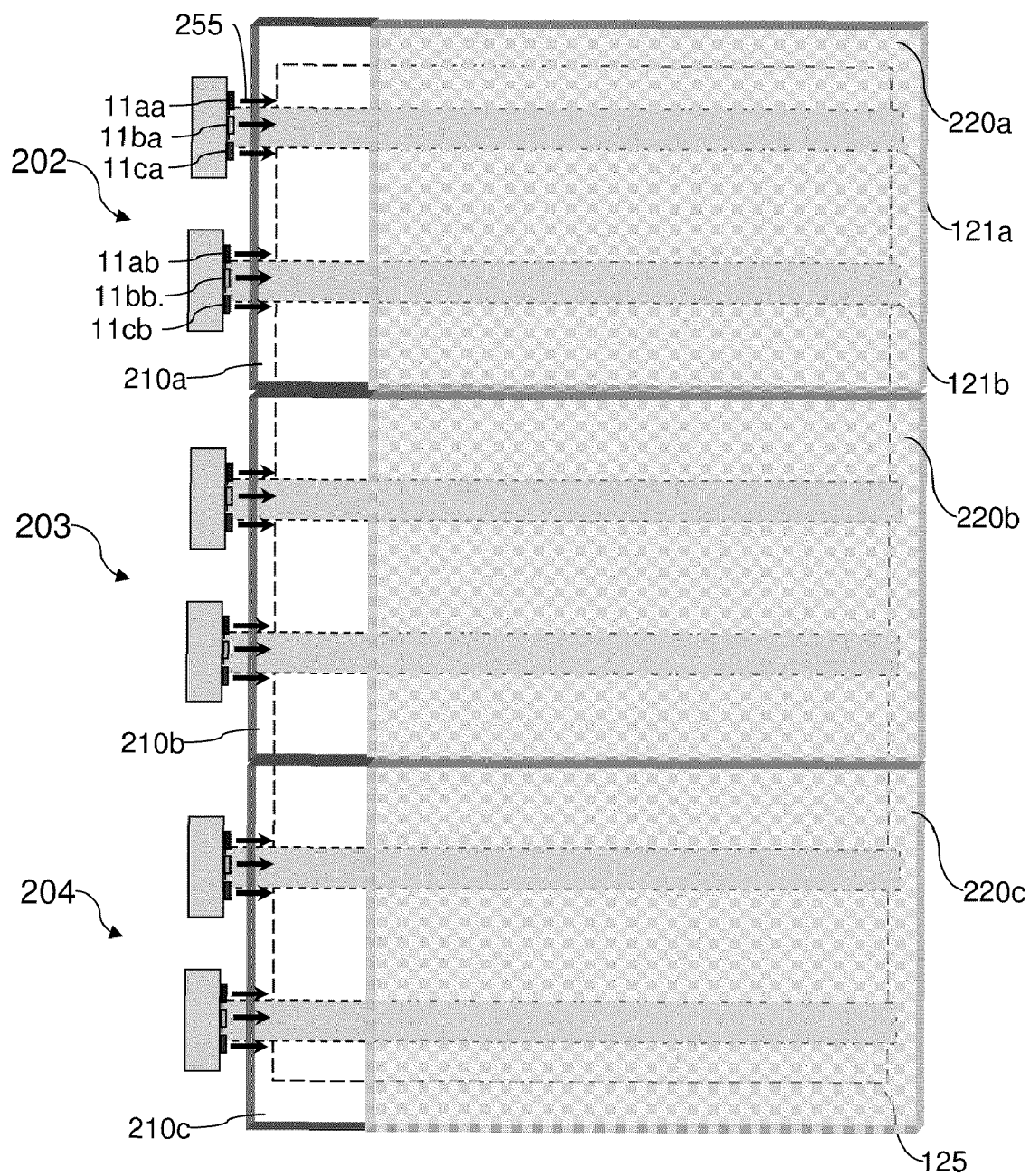
FIG. 16C shows an edge-lit LCD system including a plurality of modular panel members, according to one embodiment.

FIGS. 16A-16C illustrate top-views of edge-lit LCD systems including heat pipes, LEDs, and an edge-lit illumination panel. Such edge-lit LCD systems may be used, for example, as a backlight assembly for LCD televisions, but is should be appreciated that similar systems may also be used for general illumination, for example as illumination panels. In some embodiments, the thermal management system (e.g., including heat pipes) of the LCD may be substantially parallel to the illumination panel and/or may be disposed underneath the illumination panel, which may thereby facilitate the design of a compact LCD system.

FIG. 16A illustrates an example of a top-view of an edge-lit LCD system 201 including LEDs supported by a heat pipe. In this illustrative embodiment, multiple LED dies 11h, 11i, and 11j may be associated with one another to form a single LED, which may be supported by heat pipe 121. The LED dies may be arranged such that the direction of light emitted (represented by arrows 255) from the LED dies 11e, 11f, and 11g is substantially parallel to the heat pipe 121. It should be understood that although LED dies are shown in this embodiment, in other instances, the embodiments 11h, 11i, and 11j may be LEDs, and each of the LEDs may have one or more LED dies associated with it. In some embodiments, the assembly of the LEDs or LED dies supported by the heat pipe may be an assembly similar to those previously described herein. The LEDs or LED dies may be directly mounted on the heat pipe, on an interposer component as previously described, or on a package that is in turn directly mounted on the heat pipe or interposer component. As previously described, the heat pipes may be mounted with a suitable attachment material, which may be thermally conductive or insulating, and/or electrically conductive or insulating. In the illustrated embodiment, the heat pipes are disposed underneath an illumination panel 220 and a mixing region 210, as indicated by the dotted outline of the heat pipe 121 in FIGS. 17A-17C. Furthermore, the length of the heat pipes may be substantially parallel to the illumination panel.

It should be appreciated that although three LED dies are supported by the heat pipe in the illustrated embodiment, one or more LED dies (or one or more LEDs) may be supported. To allow for the generation of a desired color of light (e.g., white light) the plurality of LED dies 11h, 11i, 11j may be LED dies that generate different wavelengths of light. For example, a first LED die can emit red light, a second LED die can emit green light, and a third LED die can emit blue light. In other embodiments, a first LED die can emit red light, a second LED die can emit green light, a third LED die can emit blue light, and a fourth LED die can emit cyan light. In some embodiments, the LED dies are associated with one another to form a single LED.

As described above, in other embodiments, a first LED (or LED die) can emit red light, a second LED (or LED die) can emit green light, a third LED (or LED die) can emit blue light, and a fourth LED (or LED die) can emit yellow light. In still other embodiments, a first LED (or LED die) can emit red light, a second LED (or LED die) can emit green light, a third LED (or LED die) can emit blue light, and a fourth LED (or LED die) can emit yellow light, and a fifth LED (or LED die) can emit cyan light. In some embodiments, the LED dies are associated with one another to form a single LED.

Different colors of light (e.g., red, green, blue) emitted by the LED dies 11h, 11i, and 11j may be mixed or homogenized in the mixing region 210 adjacent to the LEDs. Light emitted by the LED dies (or in other embodiments, LEDs) can enter through the edge of the mixing region 210 and light mixed or homogenized within the mixing region can enter an illumination panel 220 disposed adjacent to the mixing region 210. The illumination panel 220 may have an LCD layer (not shown) disposed thereover such that light emitted from the top surface (also referred to as the viewing region) of the illumination panel may illuminate the LCD layer.

FIG. 16B illustrates a top-view of an edge-lit LCD system 202 including LEDs and multiple heat pipes. LCD system 202 is similar to system 201 previously described except that system 202 includes a plurality of heat pipes each supporting one or more LEDs. In the illustrated embodiments, heat pipes 121a and 121b are arranged in a parallel configuration with each other and also with the illumination panel 220 sides. Heat pipe 121a supports LED dies 11aa, 11ba, and 11ca, and heat pipe 121b supports LED dies 11ab, 11bb, and 11cb. In other instances, embodiments 11aa, 11ba, and 11ca are LEDs that have one or more LED dies associated with it (e.g., embodiments 11aa, 11ba, and 11ca may each be RGB LEDs). The operation of edge-lit LCD system 202 is similar to the operation of system 201, except that mixing region 210 receives light emitted by the LEDs or LED dies on both heat pipes 121a and 121b, thereby increasing the amount of light that is transmitted into the illumination panel. It should be appreciated that heat pipes 121a and 121b may be thermally connected, for example, in a manner similar to that described in the thermal management system embodiments of FIGS. 6C and 6D.

In some embodiments, an edge-lit LCD system can include a plurality of modular panel members that can be arranged side-by-side so as to form an LCD system having a desired viewing area. An LCD arrangement formed from a series of adjacent modular members can enhance the scalability of the overall design, and can allow for the formation of any desired size LCD display.

FIG. 16C illustrates a top-view of an edge-lit LCD system including an illumination panel comprising a plurality of modular panel members 220a, 220b, and 220c. Each modular panel member may be disposed over the thermal management system (e.g., the one or more heat pipes 121) having one or more LEDs (or LED dies) supported thereon. Furthermore, each modular panel member 220a, 220b, and 220c may also be respectively associated with a mixing region 210a, 210b, and 210c disposed between the LEDs (or LED dies) and each modular panel member. In the embodiment illustrated in FIG. 16C, the edge-lit LCD comprises a series of adjacent modular assemblies 202, 203, and 204, each including a plurality of heat pipes that each support one or more LEDs. In this particular illustrative embodiment, the modular assembly described is the edge-lit panel assembly illustrated in FIG. 16B, although it should be understood that any other assemblies may be used to construct the edge-lit LCD system. For example, each of the plurality of modular panel members may be disposed over one or more heat pipes (e.g., one heat pipe, two heat pipes, three heat pipes, four heat pipes).

In the illustrative embodiment, fin structure 125 is in thermal contact with the heat pipes 121 and may function as a heat sink. The fins structure 125 may be disposed underneath the modular panel members and the mixing regions, and can be incorporated as part of a tray (not shown) of the LCD system. The fin structure may be made, for example, of a substantially thermally conductive material such as aluminum and/or copper, and may have a structure and arrangement similar to that described in the fin structures of FIGS. 12A-12C or FIGS. 13A-13F.

It should be appreciated that although the illustrated embodiments of FIGS. 16A-16C show a thermal management system including heat pipes in certain arrangements, alternatively or additionally, any other type of thermal management system may be used, is including other active and/or passive thermal management systems. Examples of some other possible thermal management systems that include heat pipes were described previously in relation to the embodiments illustrated in FIGS. 11A-11D.

It should be appreciated that LCD systems may include one or more of the features described, and various combinations of features may be desirable depending on the desired display system size and/or performance. In one embodiment, an LCD display system includes a thermal management system and at least one LED supported by the thermal management system. The LED and thermal management system are arranged so that the LED emits light in a direction parallel to the thermal management system. The LCD display can further include an illumination panel associated with the LED such that light emitted from the LED enters the illumination panel. The illumination panel can be substantially parallel with the thermal management system, and a LCD layer may be disposed over the illumination panel.

The LCD systems described herein may be ultra-thin having a thickness within the above-noted ranges (e.g., less than 10 mm, less than 4 mm, less than 2 mm, or even less than 1 mm.). Amongst other advantages, the efficient thermal management provided by the heat pipe assemblies may enables use of high power and/or brightness LEDs, as described above, without problems related to heat generation. The total number of LEDs used in the system may also be decreased because of their high power and/or brightness. Furthermore, the incorporation of the heat management system (e.g., heat pipe assemblies) can ensure that during operation of the LCD system, a substantially uniform temperature profile is achieved across a viewing region of the illumination panel of the LCD system. The uniform temperature profile can aid in the generation of light having similar brightness and/or color across the viewing region of the LCD system.

Figure 17A:
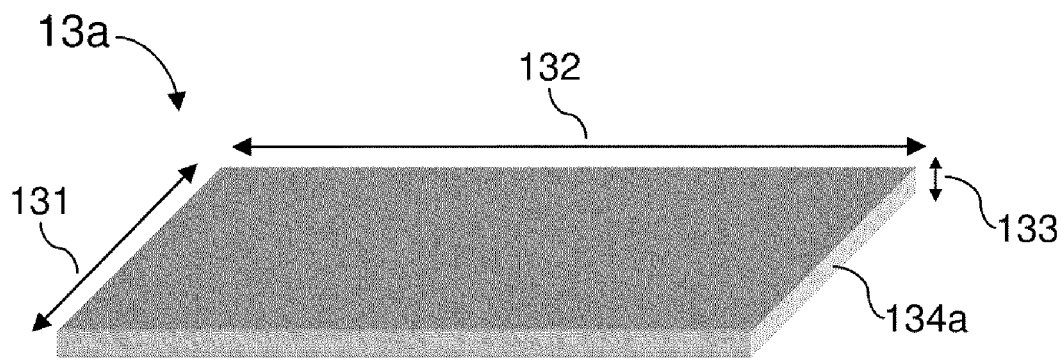
FIGS. 17A-17D illustrate various optical components which may be part of an optical system, according to one embodiment.
Figure 17B:
Figure 17C:
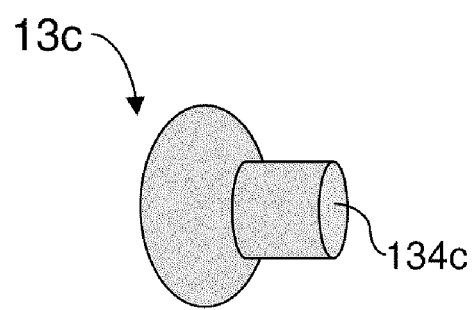
Figure 17D:
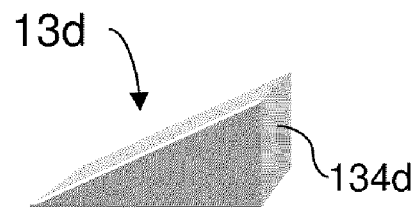

FIGS. 17A-17D illustrate embodiments of optical components which may be part of an optical system, such as the optical system illustrated in FIG. 10. One or more optical components may be included in the optical system. The optical component may have any desired shape, for example, the optical component may be a panel, a cylinder, or any other desired shape. FIG. 17A illustrates an optical component in the shape of a panel 13a, wherein the dimensions of the panel may be such that the length 132 and/or the width 132 are substantially larger than the thickness 133. In some embodiments, the thickness of the panel is less than 3 cm (e.g., less than 2 cm, less than 1 cm, less than 0.5 cm). In one embodiment, the length and/or width of the panel are less than 100 cm (e.g., less than 50 cm, less than 30 cm). In some embodiments, the length and/or width of the panel are at least 10 times greater (e.g., 20 times greater, 50 times greater, 100 times greater) than the thickness of the panel. FIG. 17B illustrates an optical component in the shape of a cylinder 13b. The cylinder may have any desired dimensions, for example, the dimensions may be similar to those of different types of fluorescent light fixtures or tubes. FIG. 17C illustrates an optical component in the shape of a bulb 13c. The bulb may have any desired dimensions, for example, the dimensions may be similar to those of different types of incandescent light bulbs. FIG. 17D illustrates an optical component in the shape of a prism 13d. Some examples of optical components that may be part of optical systems, such as display systems, include wedge-optics, mixing regions, and illumination panels.

The optical component may be formed of one or more materials including materials that are translucent and/or semi-translucent. Examples of materials that may be used to form the optical components include polycarbonate and PMMA (polymethylmethacrylate). In some embodiments, the optical component may be formed of material(s) that can transmit, diffuse, scatter, homogenize, and/or emit some or all of the light transmitted therein. The optical component may be arranged in an optical system so that light emitted from at least one LED enters the optical component. For example, in some arrangements, light from at least one LED may enter the optical component through an edge. In other embodiments, a plurality of LEDs may be arranged to emit light into the optical component. Furthermore, LEDs may be arranged to emit light into different edges and/or corners of the optical component. In the panel embodiment shown in FIG. 17A, light from an LED may enter via edge 134a of the panel and/or via any one of the corners of the panel. In the cylindrical embodiment shown in FIG. 17B, light from an LED may enter via edge 134b of the cylinder. In the bulb embodiment shown in FIG. 17C, light from an LED may enter via edge 134c of the bulb. In the prism embodiment shown in FIG. 17D, light from an LED may enter via edge 134d of the prism, and/or any other suitable edge. Although the edges in the illustrative embodiments of FIG. 17A-17D are flat surfaces, it should be appreciated that an edge need not necessarily have a flat surface. For instance, an edge may have any suitable shape, including a rounded surface, a concave surface, and/or a convex surface.

In some embodiments, an optical component may include one or more cavities and/or recesses that may be capable of receiving one or more LEDs. The cavity and/or recess may be formed on the surface of an optical component and can be used to facilitate the assembly of an optical system that can include the optical component and one or more LEDs that emit light into the optical component. In other embodiments, one or more LEDs may be embedded in the optical component. For example, one or more LEDs may be embedded into the optical component during the formation of optical component. When the optical component is formed with a molded material (e.g., using a mold injection process), one or more LEDs may be embedded into the optical component during the molding process. When the optical component is formed by joining multiple parts, one or more LEDs may be embedded in between the multiple parts. It should be appreciated that these are just some examples of methods by which one or more LEDs may be coupled to and/or embedded into an optical component and various modifications are possible.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present invention.

What is claimed is:

1. An illumination system comprising:
 a plurality of illumination panels arranged in a planar arrangement, wherein each of the plurality of illumination panels is substantially adjacent to at least one other illumination panel of the plurality of illumination panels;
 a plurality of light sources configured to emit light so that each of the plurality of illumination panels are edge-lit by one or more of the plurality of light sources through at least one edge of each of the plurality of the illumination panels;
 a light sensor configured to detect the emitted light from the plurality of light sources and output at least one signal characteristic of the detected light;
 a power source configured to supply power to at least one light source of the plurality of light sources; and a control unit configured to
receive the at least one signal from the light sensor,
obtain a value characteristic of the light emitted by the at least one light source at least partially based on the at least one signal provided by the light sensor, and
control the power source to modify the power supplied to the at least one light source at least partially based on the value characteristic of the light emitted by the at least one light source.

2. The illumination system of claim 1, wherein the control unit is configured to control the power source to modify the power supplied to the at least one light source so as to achieve a desired color point of the emitted light.

3. The illumination system of claim 1, wherein the control unit is configured to control the power source to modify the power supplied to the at least one light source so as to achieve a desired brightness of the emitted light.

4. The illumination system of claim 1, wherein the control unit is configured to obtain a value characteristic of the light emitted by the at least one light source, wherein the at least one light source is a subset smaller than the plurality of light sources.

5. The illumination system of claim 1, wherein the light sensor is configured to detect light associated with one or more wavelengths and wherein the at least one signal characteristic of the detected light comprises an indication of a color point of the detected light.

6. The illumination system of claim 1, wherein the plurality of light sources comprise a plurality of LEDs.

7. The illumination system of claim 1, wherein the plurality of light sources comprise a plurality of laser diodes.

8. The illumination system of claim 1, wherein the plurality of light sources comprise an LED coated with a phosphor.

9. The illumination system of claim 1, wherein the plurality of light sources comprise LEDs configured to emit red, green, and blue light.

10. The illumination system of claim 1, wherein the plurality of light sources comprise LEDs configured to emit cyan, amber, and yellow light.

11. The illumination system of claim 1, wherein the plurality of light sources comprise high brightness LEDs.

12. The illumination system of claim 1, wherein the plurality of light sources comprise an LED having a pattern.

13. The illumination system of claim 12, wherein the pattern has a dielectric function that varies spatially.

14. The illumination system of claim 12, wherein the pattern comprises a non-periodic pattern.

15. The illumination system of claim 12, wherein the pattern comprises a periodic pattern.

16. The illumination system of claim 1, further comprising an illumination panel illuminated by the plurality of light sources.

17. The illumination system of claim 16, wherein the plurality of light sources comprise LEDs configured to emit red, green, and blue light, and wherein the illumination panel comprises a mixing region configured to homogenize the light emitted by the plurality of LEDs thereby creating white light.

18. The illumination system of claim 16, further comprising a liquid crystal spatial light modulator disposed at least partially over the illumination panel.

19. The illumination system of claim 16, wherein the illumination panel has an illumination area and wherein a number of light sources per $m^2$ of the illumination area is less than 100.

20. The illumination system of claim 16, wherein the illumination panel is back-lit by the plurality of light sources.

21. The illumination system of claim 16, wherein the illumination panel is edge-lit by the plurality of light sources through at least one edge of the illumination panel.

22. The illumination system of claim 16, wherein the illumination panel is corner-lit by the plurality of light sources.

23. The illumination system of claim 16, further comprising an optical guide in optical communication with the illumination panel, wherein the optical guide is configured to guide at least some of the emitted light to the light sensor.

24. The illumination system of claim 1, further comprising at least one illumination panel, wherein the at least one illumination panel is edge-lit by one or more of the plurality of light sources.

25. The illumination system of claim 1, further comprising at least one illumination panel, wherein the at least one illumination panel is corner-lit by one or more of the plurality of light sources.

26. The illumination system of claim 1, further comprising a plurality of illumination panels, wherein each of the plurality of the illumination panels is back-lit by one or more of the plurality of light sources.

27. The illumination system of claim 1, wherein the plurality of illumination panels are horizontally arranged.

28. The illumination system of claim 1, wherein the plurality of illumination panels are vertically arranged.

29. The illumination system of claim 1, wherein the plurality of light sources comprise a plurality of RGB LED chipsets, wherein each RGB chipset is arranged to illuminate a different one of the illumination panels.

30. The illumination system of claim 1, wherein the plurality of illumination panels are sequentially illuminated by the plurality of light sources.

31. The illumination system of claim 30, wherein the color point of the emitted light is sequentially controlled as the plurality of illumination panels are sequentially illuminated.

32. The illumination system of claim 1, wherein the plurality of illumination panels are progressively illuminated by the plurality of illumination panels.

33. The illumination system of claim 1, wherein the plurality of illumination panels are illuminated by the plurality of light sources, and wherein the illumination to the plurality of illumination panels is sequentially turned off.

34. The illumination system of claim 1, wherein the plurality of illumination panels are illuminated by the plurality of light sources, and wherein the illumination to the plurality of illumination panels is sequentially turned on.

35. The illumination system of claim 1, wherein the control unit comprises a microprocessor unit.

36. The illumination system of claim 1, wherein the power source is configured to supply power having a pulsed signal configuration to the at least one light source.

37. The illumination system of claim 1, wherein the power source is configured to supply power having a varying amplitude signal configuration to the at least one light source.

38. The illumination system of claim 1, wherein the power source is configured to supply power to the at least one light source so that a power signal provided to the at least one light source has power supplied during a time interval for which power is not supplied to the other of the plurality of light sources.

39. The illumination system of claim 38, wherein the control unit is configured to obtain the value characteristic of the light emitted by the at least one light source at least partially based on a time division de-multiplexing operation.

40. The illumination system of claim 1, wherein the power source is configured to supply power to the at least one light source so that a power signal provided to the at least one LED has a frequency distribution distinctive from power signals provided to the other of the plurality of light sources.

41. The illumination system of claim 40, wherein the control unit is configured to obtain the value characteristic of the light emitted by the at least one light source at least partially based on the frequency distribution.

42. The illumination system of claim 41, wherein the power signal provided to the at least one light source has a frequency distribution comprising a frequency component associated with a pulsed signal and a higher frequency component associated with a signal superimposed on the pulsed signal, and wherein the higher frequency component is distinctive from the power signal provided to the other of the plurality of light sources.

43. A display system comprising:
- at least one illumination panel having at least one edge;
- a liquid crystal spatial light modulator disposed at least partially over the illumination panel; and
- a plurality of light sources configured to emit light so that the illumination panel is edge-lit by the plurality of light sources through the at least one edge of the illumination panel,
- wherein the at least one illumination panel is sequentially illuminated by the plurality of light sources.

44. The display system of claim 43, wherein the plurality of light sources comprise a plurality of LEDs.

45. The display system of claim 43, wherein the at least one illumination panel comprises a plurality of illumination panels.

46. The display system of claim 45, wherein the plurality of illumination panels are arranged in a planar arrangement, and wherein each of the plurality of illumination panels is substantially adjacent to at least one other illumination panel of the plurality of illumination panels.

47. The illumination system of claim 45, wherein the plurality of illumination panels are horizontally arranged.

48. The illumination system of claim 45, wherein the plurality of illumination panels are vertically arranged.

49. The display system of claim 43, wherein the illumination panel has an illumination area and wherein a number of light sources per $m^2$ of the illumination area is less than 100.

50. The display system of claim 43, wherein a color point of the emitted light is sequentially controlled as the illumination panel is sequentially illuminated.

* * * * *